US012648320B2

(12) United States Patent
Baek et al.

(10) Patent No.: US 12,648,320 B2
(45) Date of Patent: Jun. 2, 2026

(54) DISPLAY DEVICE

(71) Applicant: Samsung Display Co., Ltd., Yongin-si (KR)

(72) Inventors: Dae Won Baek, Cheonan-si (KR); Sang Min Yi, Suwon-si (KR); Sang Shin Lee, Yongin-si (KR); Sung Chul Kim, Seongnam-si (KR); Joon Young Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 537 days.

(21) Appl. No.: 17/547,185

(22) Filed: Dec. 9, 2021

(65) Prior Publication Data

US 2022/0102446 A1      Mar. 31, 2022

Related U.S. Application Data

(63) Continuation of application No. 16/507,733, filed on Jul. 10, 2019, now Pat. No. 11,217,639.

(30) Foreign Application Priority Data

Sep. 27, 2018     (KR) ........................ 10-2018-0114999

(51) Int. Cl.
*H10K 59/121*          (2023.01)
*H10K 59/131*          (2023.01)
(Continued)

(52) U.S. Cl.
CPC ......... *H10K 59/352* (2023.02); *H10K 59/131* (2023.02); *H10K 59/353* (2023.02); *H10K 59/60* (2023.02); *H10K 59/65* (2023.02)

(58) Field of Classification Search
CPC ..... H01L 27/32; H10K 59/352; H10K 59/121
See application file for complete search history.

(56) References Cited

U.S. PATENT DOCUMENTS 8,530,910 B2      9/2013  Song et al.
9,627,450 B2 *    4/2017  Jeung ..................... H10K 59/32
(Continued)

FOREIGN PATENT DOCUMENTS

CN          103165642 A       6/2013
CN          105748053 A       7/2016
(Continued)

OTHER PUBLICATIONS

EPO Extended Search Report dated Feb. 20, 2020, for corresponding European Patent Application No. 19200107.1 (10 pages).
(Continued)

*Primary Examiner* — Vu A Vu
*Assistant Examiner* — Valerie N Newton
(74) *Attorney, Agent, or Firm* — Womble Bond Dickinson (US) LLP

(57)      ABSTRACT

A display device is provided. The display device includes a display region which includes a first display region and a second display region, where the first display region includes a plurality of first pixels, and the second display region includes a plurality of second pixels and at least one light transmission region, where the light transmission region has light transmittance that is higher than light transmittance of the first pixel and light transmittance of the second pixel, and the second display region has light transmittance that is higher than light transmittance of the first display region.

20 Claims, 19 Drawing Sheets

DPA_D

DPA_T

(51) Int. Cl.
    *H10K 59/35*       (2023.01)
    *H10K 59/60*       (2023.01)
    *H10K 59/65*       (2023.01)

(56)           References Cited

U.S. PATENT DOCUMENTS

| | | | |
|---|---|---|---|
| 10,268,884 B2 | 4/2019 | Jones et al. | |
| 10,733,931 B2 | 8/2020 | Jung et al. | |
| 10,813,561 B2 | 10/2020 | Kwon et al. | |
| 11,138,927 B2 | 10/2021 | Jung et al. | |
| 2002/0167531 A1* | 11/2002 | Baudisch | G06F 3/1446 |
| | | | 345/611 |
| 2008/0106628 A1 | 5/2008 | Cok et al. | |
| 2011/0175097 A1 | 7/2011 | Song et al. | |
| 2011/0215712 A1 | 9/2011 | Hong | |
| 2012/0049215 A1 | 3/2012 | Yoon et al. | |
| 2012/0069241 A1 | 3/2012 | Shiau et al. | |
| 2012/0176298 A1 | 7/2012 | Suh et al. | |
| 2012/0267643 A1 | 10/2012 | Yim et al. | |
| 2013/0135328 A1 | 5/2013 | Rappoport et al. | |
| 2013/0147851 A1 | 6/2013 | Yim et al. | |
| 2013/0154910 A1 | 6/2013 | Chu et al. | |
| 2013/0208017 A1 | 8/2013 | Gu et al. | |
| 2014/0183479 A1 | 7/2014 | Park et al. | |
| 2015/0144891 A1 | 5/2015 | Park | |
| 2016/0012785 A1 | 1/2016 | Chiang | |
| 2016/0111487 A1* | 4/2016 | Jeong | H10K 59/1315 |
| | | | 257/40 |
| 2016/0268321 A1* | 9/2016 | Ihara | H01L 27/14612 |
| 2016/0302735 A1 | 10/2016 | Noguchi et al. | |
| 2016/0310027 A1 | 10/2016 | Han | |
| 2016/0365394 A1 | 12/2016 | Suh et al. | |
| 2017/0154570 A1 | 6/2017 | Suh et al. | |
| 2017/0162111 A1 | 6/2017 | Kang et al. | |
| 2017/0178566 A1 | 6/2017 | Xu et al. | |
| 2017/0214003 A1 | 7/2017 | Lee et al. | |
| 2017/0235398 A1 | 8/2017 | Choi et al. | |
| 2017/0251935 A1 | 9/2017 | Yuen | |
| 2017/0256747 A1 | 9/2017 | Lee et al. | |
| 2017/0278915 A1 | 9/2017 | Jung | |
| 2018/0005561 A1 | 1/2018 | Moon et al. | |
| 2018/0040682 A1 | 2/2018 | Ebisuno et al. | |
| 2018/0055388 A1 | 3/2018 | Morikawa et al. | |
| 2018/0129328 A1* | 5/2018 | Park | G01S 7/4814 |
| 2018/0165533 A1* | 6/2018 | Cho | G09G 5/003 |
| 2018/0177413 A1 | 6/2018 | Kwon et al. | |
| 2019/0008399 A1 | 1/2019 | Mukkamala et al. | |
| 2019/0015000 A1 | 1/2019 | Han | |
| 2019/0130822 A1 | 5/2019 | Jung et al. | |
| 2019/0355332 A1* | 11/2019 | Knez | G09G 5/391 |
| 2020/0167580 A1 | 5/2020 | Cho et al. | |
| 2021/0065620 A1 | 3/2021 | Yang et al. | |
| 2021/0067618 A1 | 3/2021 | Hong et al. | |

FOREIGN PATENT DOCUMENTS

| | | |
|---|---|---|
| CN | 107768545 | 3/2018 |
| CN | 108122942 | 6/2018 |
| CN | 108227320 A | 6/2018 |
| CN | 108459445 | 8/2018 |
| EP | 2330819 A2 | 6/2011 |
| EP | 3002790 A1 | 4/2016 |
| EP | 3342336 A1 | 7/2018 |
| EP | 3 428 967 A1 | 1/2019 |
| JP | 2010-230797 | 10/2010 |
| JP | 2011-150992 | 8/2011 |
| KR | 2012-0019026 | 3/2012 |
| KR | 2012-0080845 | 7/2012 |
| KR | 2012-0120704 | 11/2012 |
| KR | 10-1346980 B1 | 1/2014 |
| KR | 10-2014-0092119 A | 7/2014 |
| KR | 10-2017-0024182 A | 3/2017 |
| KR | 2017-0024182 | 3/2017 |
| KR | 10-2017-0049280 A | 5/2017 |
| KR | 10-2017-0067077 A | 6/2017 |
| KR | 2017-0096565 | 8/2017 |
| KR | 10-2017-0113066 A | 10/2017 |
| KR | 10-2017-0125778 A | 11/2017 |
| KR | 10-1813459 B1 | 1/2018 |
| KR | 2018-0067196 | 6/2018 |
| KR | 10-2018-0076050 A | 7/2018 |
| KR | 10-2019-0040527 A | 4/2019 |
| KR | 2020-0078686 | 7/2020 |
| WO | WO 2016/176218 A1 | 11/2016 |

OTHER PUBLICATIONS

U.S. Office Action dated Mar. 15, 2021, issued in U.S. Appl. No. 16/920,073 (12 pages).

Taiwan Office Action dated Apr. 14, 2023 regarding Taiwanese Patent Application No. 108135177 corresponding to U.S. Appl. No. 17/547,185 (9 pages).

Japanese Office Action dated Mar. 28, 2023 regarding Japanese Patent Application No. 2019-129489 corresponding to U.S. Appl. No. 17/547,185 (12 pages).

Chinese Office Action dated Jun. 24, 2024 regarding Chinese Patent Application No. 201910922510.7 corresponding to U.S. Appl. No. 17/547,185 (9 pages).

Taiwanese Office Action dated Mar. 7, 2024 regarding Taiwanese Patent Application No. 113103694 corresponding to U.S. Appl. No. 17/547,185 (5 pages).

\* cited by examiner

DPA_D

DPA_T

| PX_R | PX_G | PX_B | PX_R | PX_G | PX_B |
|------|------|------|------|------|------|
| PX_R | PX_G | PX_B | PX_R | PX_G | PX_B |

| PX_R | TA | PX_G | TA | PX_B | TA |
|------|----|------|----|------|----|
| PX_B | TA | PX_R | TA | PX_G | TA |

DISPLAY DEVICE

CROSS-REFERENCE TO RELATED APPLICATIONS

This application is a continuation of U.S. patent application Ser. No. 16/507,733, filed Jul. 10, 2019, which claims priority to and the benefit of Korean Patent Application No. 10-2018-0114999, filed Sep. 27, 2018, the entire content of both of which is incorporated herein by reference.

BACKGROUND

1. Field

The present disclosure relates to a display device.

2. Description of the Related Art

Electronic devices, such as smartphones, tablet personal computers (PCs), digital cameras, notebook computers, navigation devices, and smart televisions, which provide images to a user, include a display device for displaying images.

The display device includes a display panel and components configured to drive the display panel. Recently, the display device has been mounted with components configured to implement various functions in addition to a function to display an image on the display device. An example of the display device is a smartphone mounted with a camera, an infrared sensor, a fingerprint sensor, and the like. Generally, a size of a display screen is decreased as more optical sensing members are mounted on the smartphone.

The above information in the Background section is only for enhancement of understanding of the background of the technology and therefore it should not be construed as admission of existence or relevancy of the prior art.

SUMMARY

Aspects of the present disclosure provide a display device that has a light transmission path and is concurrently capable of maximizing a screen.

It should be noted that aspects of the present disclosure are not limited to the above-described aspects, and other aspects of the present disclosure will be apparent to those skilled in the art from the following descriptions.

Other details of exemplary embodiments for solving above problems are included in the detailed description and the drawings.

An embodiment of a display device includes a display region that includes a first display region and a second display region, wherein the first display region includes a plurality of first pixels, and the second display region includes a plurality of second pixels and at least one light transmission region, where the light transmission region has light transmittance that is higher than light transmittance of the first pixel and light transmittance of the second pixel, and the second display region has light transmittance that is higher than light transmittance of the first display region.

An embodiment of a display device includes a display region that includes a first display region and a second display region, where the display region includes a plurality of pixels and a common electrode, each of pixel electrodes is on the first display region and the second display region, the common electrode is on an entire surface of the first display region, and the common electrode is in a partial region of the second display region and defines at least one light transmission opening.

BRIEF DESCRIPTION OF THE DRAWINGS

The above and other aspects and features of the present disclosure will become more apparent by describing exemplary embodiments thereof in detail with reference to the attached drawings, in which:

FIG. 6B is a cross-sectional view illustrating a pixel and a light transmission region of a display panel according to another exemplary embodiment;

DETAILED DESCRIPTION

Figure 1:
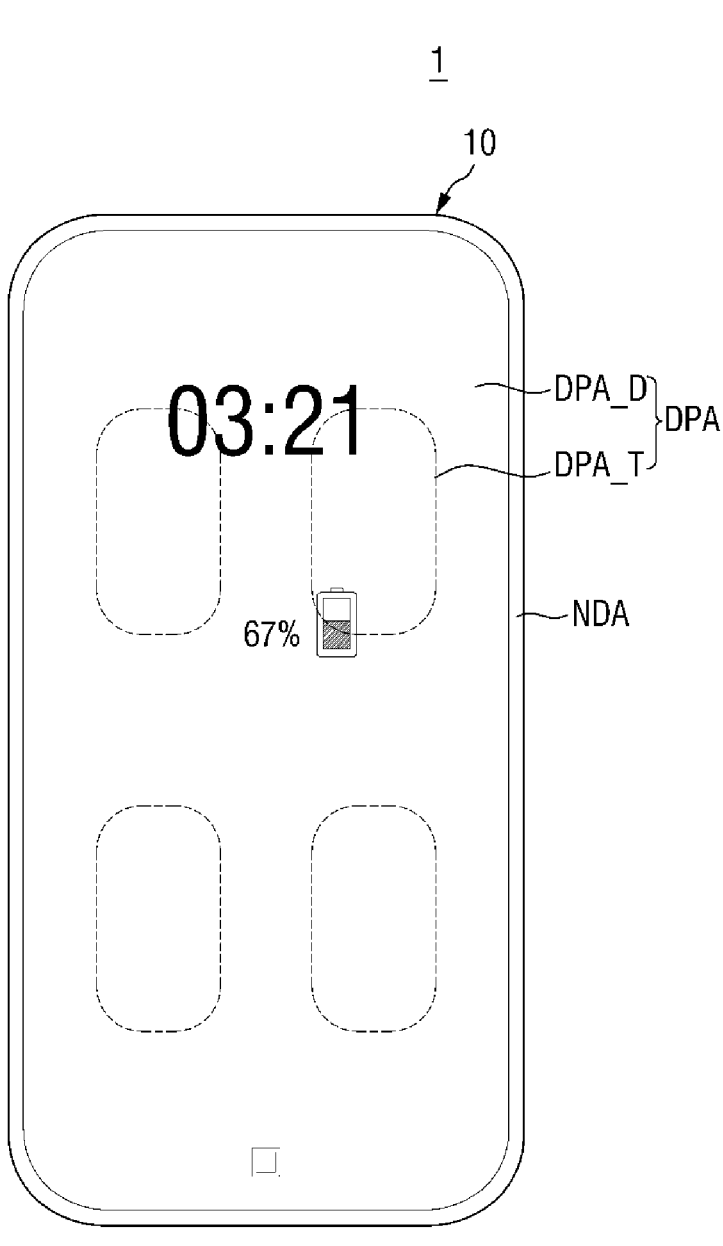
FIG. 1 is a plan view illustrating a display device according to an exemplary embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims. Like reference numerals refer to like elements throughout the specification.

It will be understood that when an element or layer is referred to as being "on", "connected to" or "coupled to" another element or layer, it can be directly on, connected or coupled to the other element or layer or intervening elements or layers may be present.

It will be understood that, although the terms first, second, etc. may be used herein to describe various elements, components, regions, areas, layers and/or sections, these elements, components, regions, layers and/or sections should not be limited by these terms. These terms are only used to distinguish one element, component, region, area, layer, or section from another region, area, layer, or section. Thus, a first element, component, region, area, layer, or section discussed below could be termed a second element, component, region, area, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Hereinafter, specific exemplary embodiments will be described with reference to the accompanying drawings.

Figure 2:
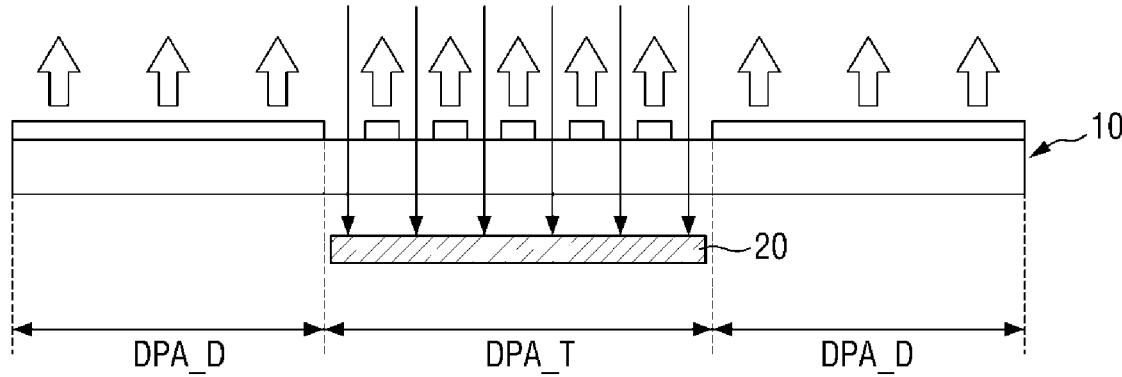
FIG. 2 is a partial cross-sectional view illustrating the display device according to the exemplary embodiment.

FIG. 1 is a plan view illustrating a display device according to an exemplary embodiment. FIG. 2 is a partial cross-sectional view illustrating the display device according to the exemplary embodiment.

A display device 1 is an electronic device including a display region DPA configured to display an image and/or a video. The display region DPA may include a display panel 10. Examples of the display panel 10 include self-luminous display panels such as an organic light-emitting diode (OLED) display panel, an inorganic electro-luminescence (EL) display panel, a quantum dot light-emitting display (QED) panel, a micro light-emitting diode (micro LED) display panel, a nano LED panel, a plasma display panel (PDP), a field emission display (FED) panel, and a cathode ray tube (CRT) display panel as well as light receiving display panels such as a liquid crystal display (LCD) panel and an electrophoretic display (EPD) panel. Hereinafter, the OLED panel will be described as an example of the display panel 10, and unless particular distinction is required, the OLED panel applied to exemplary embodiments will be simply referred to as the display panel 10. However, the exemplary embodiments are not limited to the OLED panel 10. The exemplary embodiments may include other display panels 10 listed above and/or known to those of ordinary skill in the art.

The display device 1 may further include various other components such as a controller, a housing, and a sensor in addition to the display panel 10. Any device including a display region DPA configured to display an image and/or a video may be interpreted as corresponding to the display device 1 regardless of a main use, an added function, a name, and the like of the device. Examples of the display device 1 may include, but are not limited to, a smartphone, a mobile phone, a tablet personal computer (PC), a personal digital assistant (PDA), a portable multimedia player (PMP), a television, a game machine, a wrist watch-type electronic device, a monitor of a PC, a notebook computer, a vehicle navigation device, a vehicle instrument panel, a digital camera, a camcorder, an external billboard, an electric sign board, various medical devices, various inspection devices, various household appliances such as a refrigerator and a washing machine that include a display, an object internet device, and the like.

As shown in FIG. 1, the display device 1 may include the display region DPA and a non-display region NDA. The display region DPA is a region in which an image is displayed, and the non-display region (NDA) is a region in which an image is not displayed.

The display region DPA includes a plurality of pixels. A pixel is a basic unit to display an image. The pixel may include, but is not limited to, a red pixel, a green pixel, and a blue pixel. The plurality of pixels may be alternately arranged when viewed from above. For example, the pixels may be arranged in a matrix form, but the present disclosure is not limited thereto.

Figure 6A:
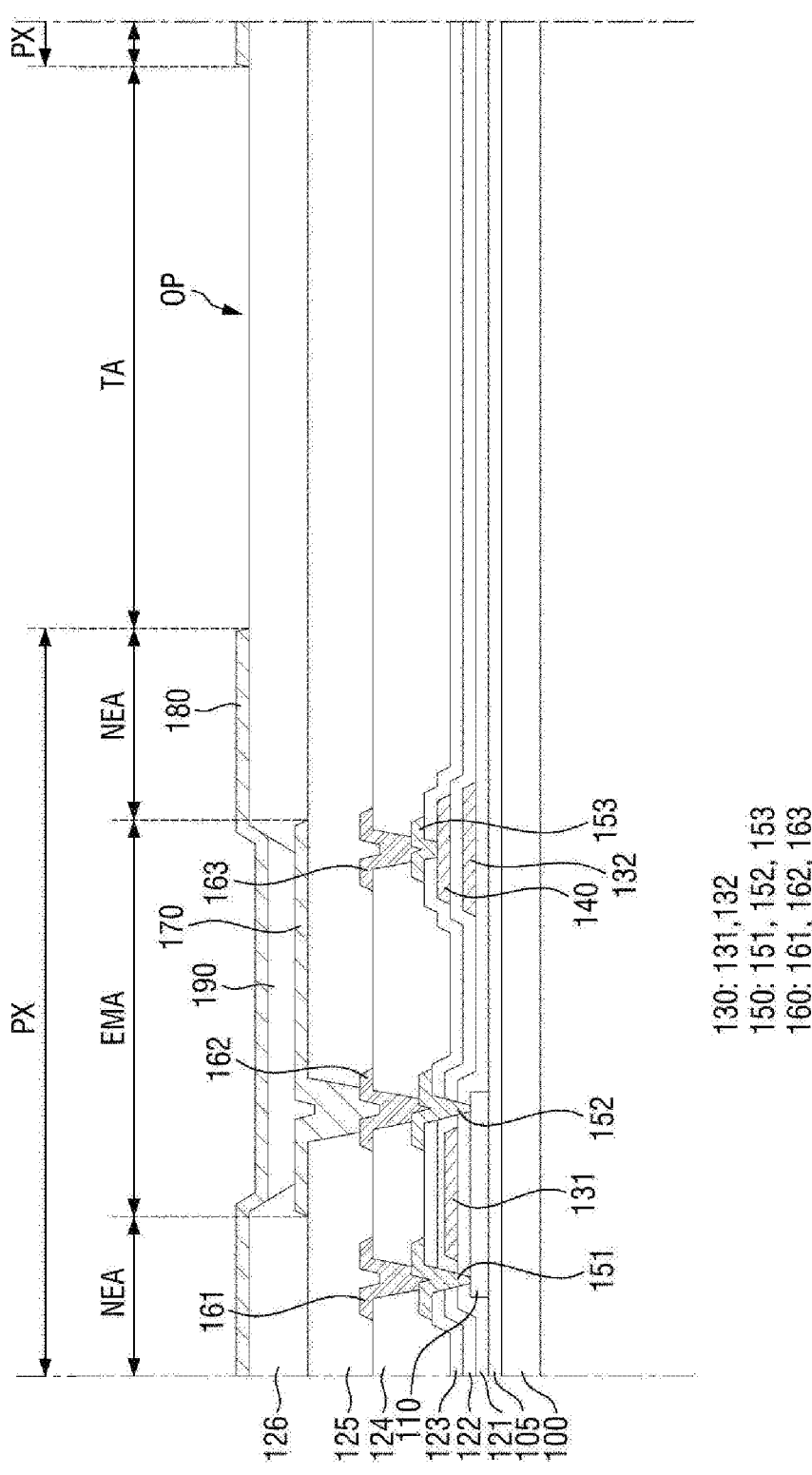
FIG. 6A is a cross-sectional view illustrating a pixel and a light transmission region of a display panel according to an exemplary embodiment.

Each pixel may include an emission region EMA (see FIG. 6A). The emission region may be defined as a region in which a light-emitting material, e.g., an organic light-emitting layer, is located. A planar size of the organic light-emitting layer may be smaller than a size of the pixel. A region in which a light-emitting material, e.g., an organic light-emitting layer, is not present in the pixel may be defined as a non-emission region NEA (see FIG. 6A). Circuits and/or lines for driving the pixel may be in the non-emission region, but the present disclosure is not limited thereto.

The non-display region NDA may be around the display region DPA. In an exemplary embodiment, the display region DPA may be in a rectangular shape, and the non-display region NDA may be around four sides of the display region DPA, but the present disclosure is not limited thereto. A black matrix may be in the non-display region NDA to prevent light emitted from adjacent pixels from leaking.

The display region DPA may be divided into at least two second display region according to whether a light trans-mission region TA is provided. For example, the display region DPA may include a first display region DPA_D and a second display region DPA_T. The first display region DPA_D may be a display-only region and the second display region DPA_T may be a display transmission region.

In some embodiments, an area of the first display region DPA_D may be larger than an area of the second display region DPA_T.

The display region DPA may include a plurality of second display regions DPA_T separated from each other. The first display region DPA_D may be around each of the second display regions DPA_T. The first display region DPA_D may partially or wholly (e.g., entirely) surround each of the second display regions DPA_T. The first display region DPA_D and the second display region DPA_T may be adjacent to each other and may be continuously located without separate physical distinction. In an exemplary embodiment, the first display region DPA_D and the second display region DPA_T may not be visually distinguished, but the present disclosure is not limited thereto.

Figure 3:
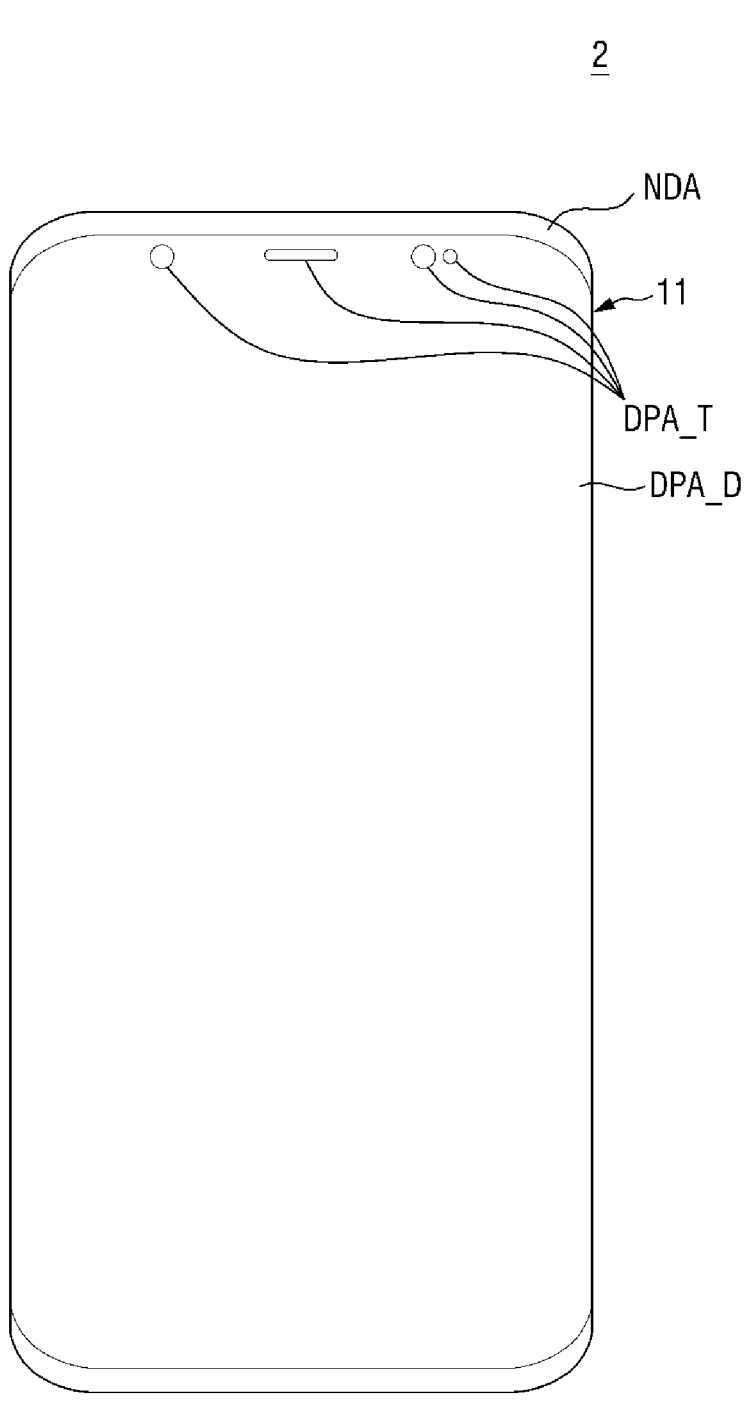
FIG. 3 is a plan view illustrating a display device according to another exemplary embodiment.

There is no restriction to an arrangement region of the second display region DPA_T within the display region DPA. For example, as shown in FIG. 1, the second display regions DPA_T may be in a central region of the display region DPA that is spaced apart from the non-display region NDA. In another example, as shown in FIG. 3 and/or FIG. 4, the second display regions DPA_T may be at an edge of the display region DPA and may be in contact with or adjacent to the non-display region NDA.

Both of the first display region DPA_D and the second display regions DPA_T include a plurality of pixels including an emission region to display an image through light emission of each pixel. The second display region DPA_T further includes a plurality of light transmission regions TA (see FIG. 6A) in addition to the pixels including the emis-sion region. The first display region DPA_D does not include a light transmission region.

The light transmission region of the second display region DPA_T is a region which does not emit light itself and transmits light in a thickness direction thereof. The light may include light having a visible light wavelength as well as light having near-infrared and/or infrared wavelengths. The light transmitted through the light transmission region may further include light having near-ultraviolet and/or ultravio-let wavelengths.

A non-emission region of the first display region DPA_D or the second display region DPA_T is also a region which does not emit light itself. The light transmission region has light transmittance that is higher than that of the non-emission region. Here, the light transmittance is transmit-tance of light passing through each region and refers to transmittance of light traveling in a thickness direction of each region. Therefore, the second display region DPA_T including the light transmission region has light transmit-tance that is higher than that of the first display region DPA_D. In some embodiments, the transmittance of the light transmitting region is 5% to 90%. In some embodi-ments, the transmittance of the non-emission region is less than 5%. The second display region DPA_T may be utilized for various purposes. In an example, the second display region DPA_T may be utilized like a transparent display. In this case, other components are not on a rear surface of the second display region DPA_T, and an object on the rear surface may be identified through the second display region DPA_T like a window.

In another example of using light transmission of the second display region DPA_T, the second display region DPA_T is utilized as a path for optical sensing. Specifically, as shown in FIG. 2, the display device 1 may include a light sensing member 20 below the second display region DPA_T of the display panel 10. The light sensing member 20 is a member that receives light to acquire information and/or exhibit a specific function. Examples of the light sensing member 20 may include a camera, an infrared proximity sensor, an iris recognition sensor, a fingerprint sensor, and the like, which may include a photoelectric conversion element. A required amount of light may be changed accord-ing to a type of the light sensing member 20 and may be transferred by adjusting an aperture ratio of a corresponding second display region DPA_T and/or the light transmittance of the light transmission region, wherein the aperture ratio is a ratio of an area occupied by the light transmission region to the total area of the second display region DPA_T. For example, transmittance of light passing through the light transmission region may be controlled by adjusting an area of the light transmission region to the total area of the second display region DPA_T and/or adjusting a stacked structure and/or a material in a thickness direction thereof so that it is possible to appropriately design light transmittance per unit area and the total light transmission amount (average light transmittance×area) of the entire second display region DPA_T. In some embodiments, a transmittance of the sec-ond display region DPA_T is 5% to 90% and a transmittance of the first display region DPA_D is less than 5%.

In some exemplary embodiments, the display device 1 may include a plurality of different light sensing members 20. In this case, transmittances of second display regions DPA_T corresponding to respective light sensing members 20 may be differently adjusted according to the maximum amount of light required by the light sensing members 20 corresponding thereto. One method of variously adjusting transmittances of each second display region DPA_T is to adjust a size and/or an arrangement of the pixels and the light transmission regions of each second display region DPA_T. This will be described in detail below. In another exemplary embodiment, transmittances of second display regions DPA_T corresponding to respective light sensing member 20 may be adjusted to be equal to necessary transmittances of the light sensing members requiring the maximum amount of light.

In an emission mode in which the display device 1 displays a screen, because the pixels around the light transmission region also emit light, a corresponding region may be visible as the display region DPA, and the light transmission region may not be visible. On the contrary, in a non-emission mode in which the display device 1 does not display an image on the screen, because the pixels around the light transmission region do not emit light, external light may be reflected by the light sensing member 20, and thus, the light sensing member 20 may be visible. When the light sensing member 20 is visible inside the display region DPA, it may lead to a cosmetic defect. In order to prevent the light sensing member 20 from being visible, the light sensing member 20 may be subjected to surface treatment such as matte treatment, black coating, and/or anti-reflective coating.

FIG. 3 is a plan view illustrating a display device according to another exemplary embodiment. In a display device 2 of FIG. 3, an example case in which a second display region DPA_T is near an upper side of a display panel 11 is illustrated. In the exemplary embodiment of FIG. 3, an example case is illustrated in which non-display regions NDA of the display panel 11 are provided at upper and lower sides corresponding to short sides of the display panel 11 and at least one second display region DPA_T is spaced apart from the non-display region NDA at the upper side and is near to the non-display region NDA. A camera, an iris recognition sensor, a near infrared ray sensor, and the like may be superimposed in each second display region DPA_T. The second display region DPA_T displays a screen and concurrently transmits light to allow optical sensing to be performed. When sensors are superposed in a display region DPA, necessity for arranging a sensor in the non-display region NDA may be reduced. Thus, a width of the non-display region NDA may be reduced. Accordingly, a bezel width of the display device 2 including various sensing functions may be reduced, and a size of a display screen may be maximized.

Figure 4:
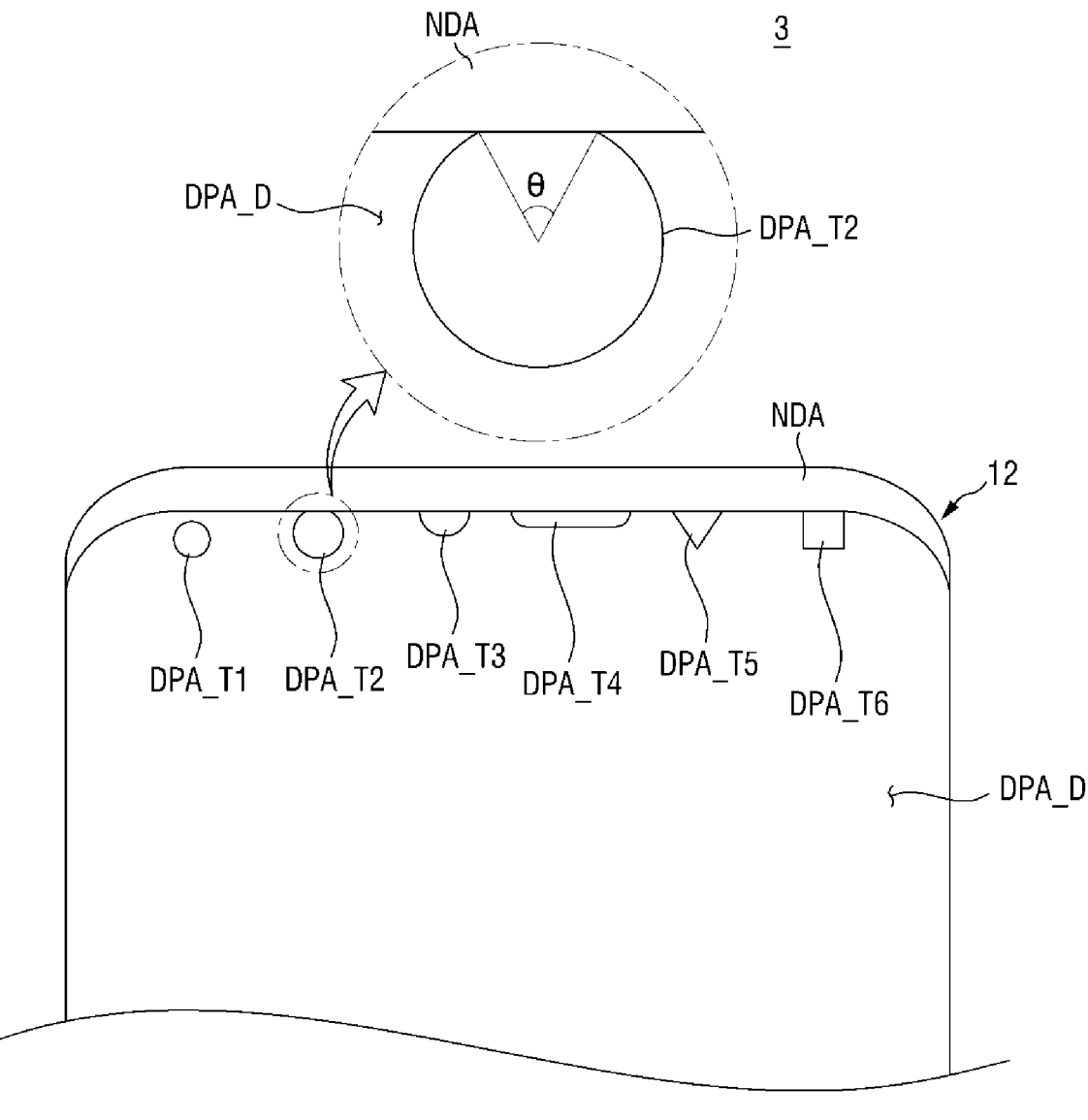
FIG. 4 is a plan view illustrating a display device according to still another exemplary embodiment.

FIG. 4 is a plan view illustrating a display device according to another exemplary embodiment and illustrating various shapes and arrangements applicable to second display regions. FIG. 4 illustrates six different second display regions DPA_T1 to DPA_T6 that are arranged along an upper side of a display panel 12 in a display device 3. For convenience of description, the second display regions arranged in a left-to-right direction of the drawing are referred to as first to sixth second display regions DPA_T1 to DPA_T6.

An example case is illustrated in which the first second display region DPA_T1 is spaced apart from a non-display region NDA located at the upper side of the display panel 12. As shown, the first second display region DPA_T1 may have a circular (or elliptical) shape, and a periphery (e.g., circumference) thereof may be surrounded by a first display region DPA_D.

An example case is illustrated in which a portion of each of the second to sixth second display regions DPA_T2 to DPA_T6 is in contact with the non-display region NDA located at the upper side of the display panel 12.

An example case is illustrated in which the second second display region DPA_T2 and the third second display region DPA_T3 have a straight cut shape (arcuate shape) of a circle (or an ellipse). An internal angle θ of a figure formed by both ends of a straight cut line (arcuate line) and a center of the circle (arcuate shape) may be in a range of 10° to 180°. An example case is illustrated in which the third second display region DPA_T3 has a semicircular shape in which the internal angle δ is 180°.

An example case is illustrated in which the fourth second display region DPA_T4 has a rectangular shape having a long lateral length and both short sides thereof forming a convex curve. An example case is illustrated in which the fifth second display region DPA_T5 has a triangular shape and the sixth second display region DPA_T6 has a square shape.

The shape and arrangement of the second display regions DPA_T are not limited to those illustrated in FIG. 4.

Hereinafter, structures of a pixel and a light transmission region of each display region DPA will be described in detail.

Figure 5:
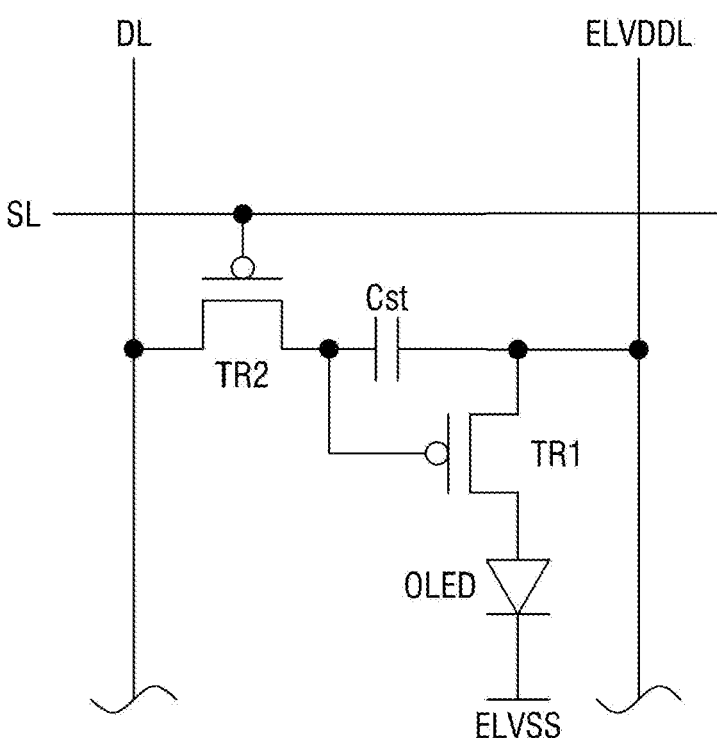
FIG. 5 is a circuit diagram illustrating one pixel of a display device according to an exemplary embodiment.

FIG. 5 is a circuit diagram illustrating one pixel of a display device according to an exemplary embodiment.

Referring to FIG. 5, a pixel circuit may include a first transistor TR1, a second transistor TR2, a capacitor Cst, and an OLED. A scan line SL, a data line DL, and a first power voltage line ELVDDL are connected to each pixel circuit.

The first transistor TR1 may be a driving transistor, and the second transistor TR2 may be a switching transistor. Although both of the first transistor TR1 and the second transistor TR2 are illustrated in the drawing as being p-channel metal-oxide-semiconductor (PMOS) transistors, any one and/or both of the first transistor TR1 and the second transistor TR2 may be n-channel metal-oxide-semiconductor (NMOS) transistors.

A first electrode (e.g., source electrode) of the first transistor TR1 is connected to the first power voltage line ELVDDL, and a second electrode (e.g., drain electrode) thereof is connected to an anode of the OLED. A first electrode (e.g., source electrode) of the second transistor TR2 is connected to the data line DL, and a second electrode (e.g., drain electrode) thereof is connected to a gate electrode of the first transistor TR1. The capacitor Cst is connected between the gate electrode and the first electrode of the first transistor TR1. A second power voltage ELVSS is received through a cathode of the OLED. The second power voltage ELVSS may be lower than a first power voltage ELVDD provided from the first power source voltage line ELVDDL.

The second transistor TR2 may output a data signal applied to the data line DL in response to a scan signal applied to the scan line SL. The capacitor Cst may be charged with a voltage corresponding to the data signal received from the second transistor TR2. The first transistor TR1 may control a driving current flowing through the OLED in accordance with electric charges stored in the capacitor Cst.

An equivalent circuit of FIG. 5 is merely one exemplary embodiment, and the pixel circuit may include a greater number of transistors and capacitors (for example, 7).

FIG. 6A is a cross-sectional view illustrating a pixel and a light transmission region of a display panel according to an exemplary embodiment. In FIG. 6A, among two transistors of FIG. 5, the first transistor TR1 is illustrated in the form of a thin film transistor, and the second transistor TR2 is not illustrated.

First, a cross-sectional structure of a pixel PX will be described in detail with reference to FIG. 6A. The display panel may include a substrate 100, a buffer layer 105, a semiconductor layer 110, a first insulating layer 121, a first conductive layer 130 (e.g., 131, 132), a second insulating layer 122, a second conductive layer 140, a third insulating layer 123, a third conductive layer 150 (e.g., 151, 152), a fourth insulating layer 124, a fourth conductive layer 160 (e.g., 161, 162, 163), a fifth insulating layer 125, a fifth conductive layer 170, a pixel definition film 126 having an opening configured to expose the fifth conductive layer 170, an organic layer 190 in the opening of the pixel definition film 126, and a sixth conductive layer 180 on the pixel definition film 126 and the organic layer 190. Each of the above-described layers may include a single film but may include a stacked film including a plurality of films. Other layers may be further located between the respective layers.

The substrate 100 supports the respective layers thereon. The substrate 100 may be made of an insulating material such as a polymer resin. For example, the polymeric material may include one selected from among polyethersulphone (PES), polyacrylate (PA), polyarylate (PAR), polyetherimide (PEI), polyethylene naphthalate (PEN), Polyethylene terepthalate (PET), polyphenylene sulfide (PPS), polyallylate, polyimide (PI), polycarbonate (PC), cellulose triacetate (CAT), cellulose acetate propionate (CAP), and combinations thereof. The substrate 100 may be a flexible substrate which is bendable, foldable, and rollable. An example of a material constituting the flexible substrate is polyimide (PI), but the present disclosure is not limited thereto.

The buffer layer 105 is on the substrate 100. The buffer layer 105 may prevent diffusion of impurity ions and permeation of moisture and/or ambient air, and may perform a surface planarization function. The buffer layer 105 may include silicon nitride, silicon oxide, silicon oxynitride, or the like. The buffer layer 105 may be omitted according to the type of the substrate 100, process conditions, and the like.

The semiconductor layer 110 is on the buffer layer 105. The semiconductor layer 110 forms a channel of a thin film transistor of the pixel PX. The semiconductor layer 110 may include polycrystalline silicon. However, the present disclosure is not limited thereto, and the semiconductor layer 110 may include monocrystalline silicon, low temperature polycrystalline silicon, amorphous silicon, and/or an oxide semiconductor. The oxide semiconductor may be a binary compound (ABx), a ternary compound (ABxCy), or a quaternary compound (ABxCyDz), which includes indium, zinc, gallium, tin, titanium, aluminum, hafnium (Hf), zirconium (Zr), magnesium (Mg), or the like.

The first insulating layer 121 may be a gate insulating film having a gate insulating function. The first insulating layer 121 may include a silicon compound, a metal oxide, or the like. For example, the first insulating layer 121 may include silicon oxide, silicon nitride, silicon oxynitride, aluminum oxide, tantalum oxide, hafnium oxide, zirconium oxide, titanium oxide, or the like. These may be used alone or in combination with each other. The first insulating layer 121 may be a single film or a multilayer film including a stacked film of different materials.

The first insulating layer 121 is on the semiconductor layer 110 and may be on an entire surface of the substrate 100.

The first conductive layer 130 is on the first insulating layer 121. The first conductive layer 130 may be a first gate conductive layer. The first conductive layer 130 may include a gate electrode 131 of the thin film transistor of the pixel PX, a scan line connected thereto, and a first storage capacitor electrode 132.

The first conductive layer 130 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 130 may be a single film or a multilayer film.

The second insulating layer 122 may be on the first conductive layer 130. The second insulating layer 122 may be an interlayer insulating film. The second insulating layer 122 may include an inorganic insulating material such as silicon oxide, silicon nitride, silicon oxynitride, hafnium oxide, aluminum oxide, titanium oxide, tantalum oxide, or zinc oxide.

The second conductive layer 140 is on the second insulating layer 122. The second conductive layer 140 may be a second gate conductive layer. The second conductive layer 140 may include a second storage capacitor electrode 140. The second conductive layer 140 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second conductive layer 140 may be made of the same material as the first conductive layer 130, but the present disclosure is not limited thereto. The second conductive layer 140 may be a single film or a multilayer film.

The third insulating layer 123 is on the second conductive layer 140. The third insulating layer 123 may be an interlayer insulating film. The third insulating layer 123 may include an inorganic insulating material such as silicon oxide, silicon nitride, silicon oxynitride, hafnium oxide, aluminum oxide, titanium oxide, tantalum oxide, or zinc oxide, or an organic insulating material such as a polyacrylate-based resin, an epoxy resin, a phenolic resin, a polyamide-based resin, a polyimide-based resin, an unsaturated polyester-based resin, a poly phenylenether-based resin, a polyphenylene sulfide-based resin, or benzocyclobutene (BCB). The third insulating layer 123 may be a single film or a multilayer film including a stacked film of different materials.

The third conductive layer 150 is on the third insulating layer 123. The third conductive layer 150 may be a first source/drain conductive layer. The third conductive layer 150 may include a first electrode 151 and a second electrode 152 of the thin film transistor of the pixel PX. The first electrode 151 and the second electrode 152 of the thin film transistor may be electrically connected to a source region and a drain region of the semiconductor layer 110 through contact holes passing through the third insulating layer 123, the second insulating layer 122, and the first insulating layer 121. A first power voltage electrode 153 of the pixel PX may also be included in the third conductive layer 150.

The third conductive layer 150 may include at least one metal selected from among aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 150 may be a single film or a multilayer film. For example, the third conductive layer 150 may have a stacked structure of Ti/Al/Ti, Mo/Al/Mo, Mo/AlGe/Mo, Ti/Cu, or the like.

The fourth insulating layer 124 is on the third conductive layer 150. The fourth insulating layer 124 covers the third conductive layer 150. The fourth insulating layer 124 may be a via layer. The fourth insulating layer 124 may include an organic insulating material such as a polyacrylate-based resin, an epoxy resin, a phenolic resin, a polyimide-based resin, a polyimide-based resin, an unsaturated polyester-based resin, a poly phenylenether-based resin, a polyphenylene sulfide-based resin, or benzocyclobutene (BCB).

The fourth conductive layer 160 is on the fourth insulating layer 124. The fourth conductive layer 160 may be a second source/drain conductive layer. The fourth conductive layer 160 may include a data line, a connection electrode 162, and first power voltage lines 161 and 163 of the pixel PX. The first power voltage line 161 may be electrically connected to the first electrode 151 of the thin film transistor of the pixel PX through a contact hole passing through the fourth insulating layer 124 in the pixel PX. The connection electrode 162 may be electrically connected to the second electrode 152 of the thin film transistor of the pixel PX through a contact hole passing through the fourth insulating layer 124. The first power voltage line 163 may also be electrically connected to the first power voltage electrode 153 through a contact hole passing through the fourth insulating layer 124.

The fourth conductive layer 160 may include at least one metal selected from among aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The fourth conductive layer 160 may be a single film or a multilayer film. The fourth conductive layer 160 may be made of the same material as the third conductive layer 150, but the present disclosure is not limited thereto.

The fifth insulating layer 125 is on the fourth conductive layer 160. The fifth insulating layer 125 covers the fourth conductive layer 160. The fifth insulating layer 125 may be a via layer. The fifth insulating layer 125 may include the same material as the fourth insulating layer 124 described above or may include at least one material selected from the exemplified materials constituting the fourth insulating layer 124.

The fifth conductive layer 170 is on the fifth insulating layer 125. An anode, which is a pixel electrode, may be the fifth conductive layer 170. The anode may be electrically connected to the connection electrode 162 included in the fourth conductive layer 160 through a contact hole passing through the fifth insulating layer 125 and may be connected to the second electrode 152 of the thin film transistor through the connection electrode 162. The anode may partially overlap at least an emission region EMA of the pixel PX.

The fifth conductive layer 170 may have, but is not limited to, a stacked film structure formed by stacking a material layer having a high work function and a reflective material layer, wherein the material layer is made of at least one of indium tin oxide (ITO), indium zinc oxide (IZO), zinc oxide (ZnO), indium oxide ($In_2O_3$), and the reflective material layer is made of one selected from among silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), and mixtures thereof. The material layer having the high work function may be on the reflective material layer and may be near to the organic layer 190. The fifth conductive layer 170 may have a multilayer structure of ITO/Mg, ITO/MgF, ITO/Ag, or ITO/Ag/ITO, but the present disclosure is not limited thereto.

The pixel definition film 126 may be on the fifth conductive layer 170. The pixel definition film 126 may partially overlap at least a non-emission region NEA of the pixel PX. The pixel definition film 126 may have the opening configured to expose the fifth conductive layer 170. The pixel definition film 126 may include an inorganic insulating material such as silicon oxide, silicon nitride, silicon oxynitride, hafnium oxide, aluminum oxide, titanium oxide, tantalum oxide, or zinc oxide, or an organic insulating material such as a polyacrylate-based resin, an epoxy resin, a phenolic resin, a polyimide-based resin, a polyimide-based resin, an unsaturated polyester-based resin, a poly phenylenether-based resin, a polyphenylene sulfide-based resin, or benzocyclobutene (BCB). The pixel definition film 126 may be a single film or a multilayer film including a stacked film of different materials.

The organic layer 190 is in the opening of the pixel definition film 126. The organic layer 190 may include an organic light-emitting layer, a hole injection/transport layer, and an electron injection/transport layer. The organic layer 190 may overlap the emission region EMA.

The sixth conductive layer 180 is on the pixel definition film 126 and the organic layer 190. A cathode, which is a common electrode, may be the sixth conductive layer 180. The cathode may be located not only in the emission region EMA of the pixel PX but also in the non-emission region NEA. That is, the cathode may be on an entire surface of each pixel PX. The sixth conductive layer 180 may include a material layer having a low work function, which is made of one selected from among Li, Ca, LiF/Ca, LiF/AI, Al, Mg, Ag, Pt, Pd, Ni, Au Nd, Ir, Cr, BaF, Ba, and compounds or mixtures thereof. The sixth conductive layer 180 may further include a transparent metal oxide layer on the material layer having the low work function.

Although not shown in the drawing, an encapsulation film may be on the sixth conductive layer 180. The encapsulation film may include an inorganic film. In an exemplary embodiment, the encapsulation film may include a first inorganic film, an organic film on the first inorganic film, and a second inorganic film on the organic film.

A cross-sectional structure of a light transmission region TA will be described. The light transmission region TA has a structure in which some layers are removed from a stacked structure of the pixel PX. Because the light transmission region TA is a region which does not emit light, it is possible to omit layers corresponding to an anode, an organic light-emitting layer, a cathode, and the like. Due to the omission of the layers, the light transmission region TA may have transmittance higher than that the pixel PX.

Specifically, the sixth conductive layer 180, which is the cathode, is not in the light transmission region TA. The cathode is a common electrode, and the sixth conductive layer 180 is in an entire region of the pixel PX. However, the sixth conductive layer 180 is removed in the light transmission region TA to form a light transmission opening OP. The light transmission opening OP may be defined by the sixth conductive layer 180. In a top emission type panel, a cathode transmits a certain amount of light but reflects and/or absorbs a significant amount of light. Because the sixth conductive layer 180, e.g., the cathode, is not in the light transmission region TA, higher transmittance may be secured as compared to the non-emission region NEA of the pixel PX.

In addition, the fifth conductive layer 170, which is an anode, may not be in the light transmission region TA. In the top emission type panel, an anode includes the reflective material layer as described above. Because the fifth conductive layer 170 is not in the light transmission region TA, light may be transmitted in a thickness direction of the light transmission region. In addition, because the organic layer 190 is not in the light transmission region TA, higher transmittance may be maintained. Furthermore, the semiconductor layer and/or other conductive layers may not be in the light transmission region TA.

As shown in FIG. 6A, an example stacked structure of the light transmission region TA may include the substrate, the buffer layer 105, the first insulating layer 121, the second insulating layer 122, the third insulating layer 123, the fourth insulating layer 124, the fifth insulating layer 125, and the pixel definition film 126.

Figure 6B:
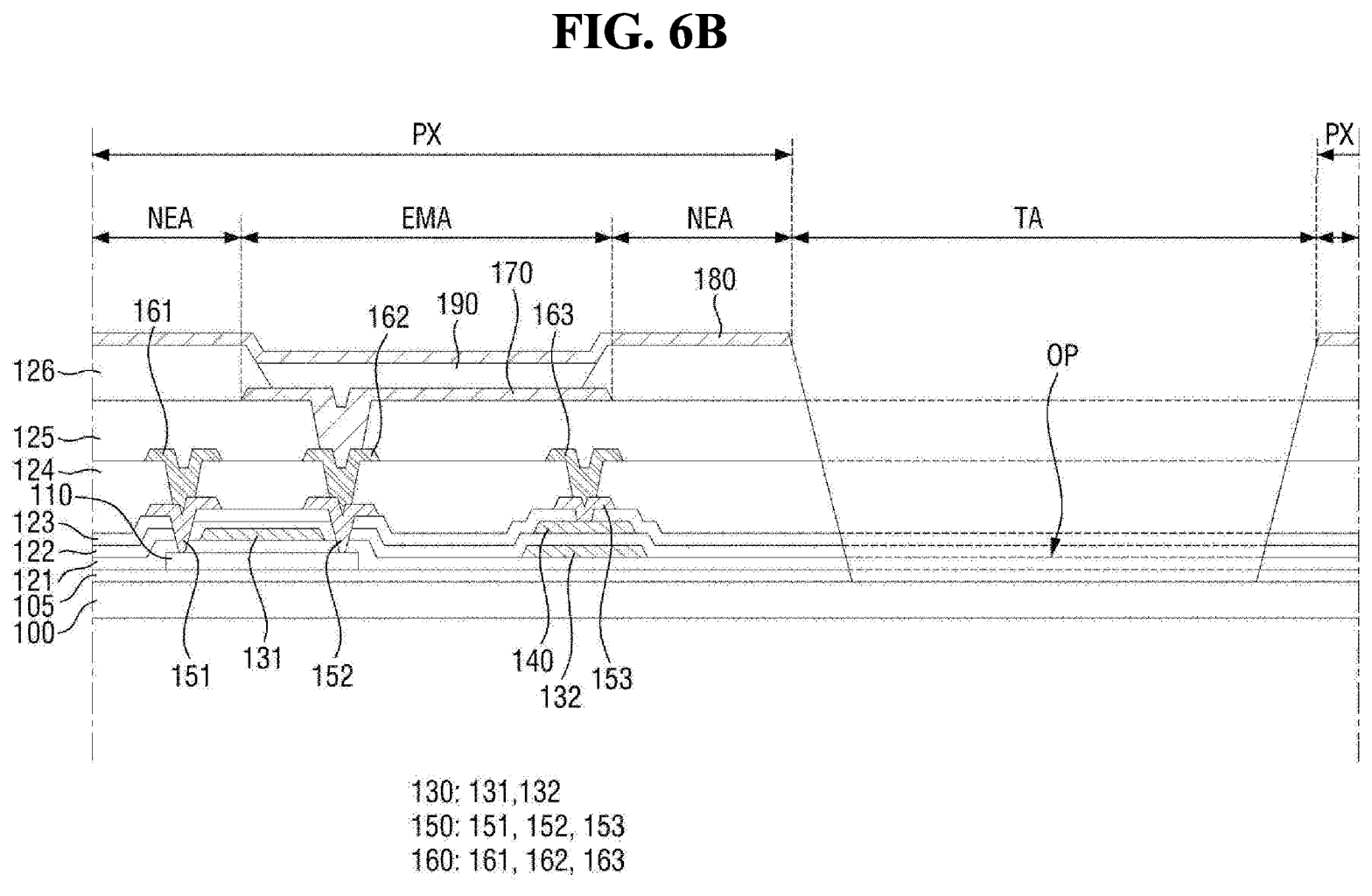

FIG. 6B is a cross-sectional view illustrating a pixel and a light transmission region of a display panel according to another exemplary embodiment. FIG. 6B illustrates that insulating films of a light transmission region TA may be further omitted from the structure of FIG. 6A.

That is, as shown by a solid line in FIG. 6B, in the light transmission region TA, a pixel definition film 126, a fifth insulating layer 125, a fourth insulating layer 124, a third insulating layer 123, a second insulating layer 122, a first insulating layer 121, and a buffer layer 105 may be all removed, and a surface of a substrate 100 may be exposed. A light transmission opening OP may be defined by a sixth conductive layer 180, the pixel definition film 126, the fifth insulating layer 125, the fourth insulating layer 124, the third insulating layer 123, the second insulating layer 122, the first insulating layer 121, and the buffer layer 105. The substrate 100 may still not be removed in the light transmission region TA. That is, the substrate 100 may overlap the light transmission region TA and may not have a through-hole in the light transmission region TA. As described above, in the case of the exemplary embodiment of FIG. 6B, because many insulating layers are further removed, transmittance of the light transmission region TA may be further improved as compared with the exemplary embodiment of FIG. 6A.

In another example, as shown by a dotted line in FIG. 6B, in the light transmission region TA, some of the pixel definition film 126, the fifth insulating layer 125, the fourth insulating layer 124, the third insulating layer 123, the second insulating layer 122, the first insulating layer 121, and the buffer layer 105 may be removed. For example, the present disclosure is not limited thereto, but the fourth insulating layer 124 corresponding to a via layer and all the layers located above the fourth insulating layer 124 may be removed to form a light transmission opening OP.

Hereinafter, various arrangements of pixels PX and light transmission regions TA of a first display region DPA_D and a second display region DPA_T will be described in detail with reference to FIGS. 7-15. In the respective drawings, a horizontal direction is referred to as a first direction D1, and a vertical direction is referred to as a second direction D2. The first direction D1 and the second direction D2 are illustrated as being perpendicular to each other. In the respective drawings, a left drawing illustrates a first display region DPA_D, and a right drawing illustrates a second display region DPA_T. Unless otherwise stated, it is assumed that the first display region DPA_D and the second display region DPA_T have the same size. A basic arrangement of the pixels PX and/or the light transmission regions TA illustrated in the respective drawings indicates a portion of repeated arrangements of a corresponding region, and more pixels PX and/or light transmission regions TA may be arranged in the first direction D1 and/or the second direction D2 so as to have identical or similar arrangement to the illustrated basic arrangement.

Because the second display region DPA_T further includes the light transmission region TA as compared to the first display region DPA_D, the second display region DPA_T may differ from the first display region DPA_D in size of the pixel PX, arrangement of the pixel PX, density of the pixel PX related to resolution, arrangement of a line for driving the pixel PX, and the like.

FIGS. 7-10 illustrates example embodiments in which the first display region DPA_D and the second display region DPA_T include the pixels PX having the same size, but the pixels PX have different densities.

Figure 7:
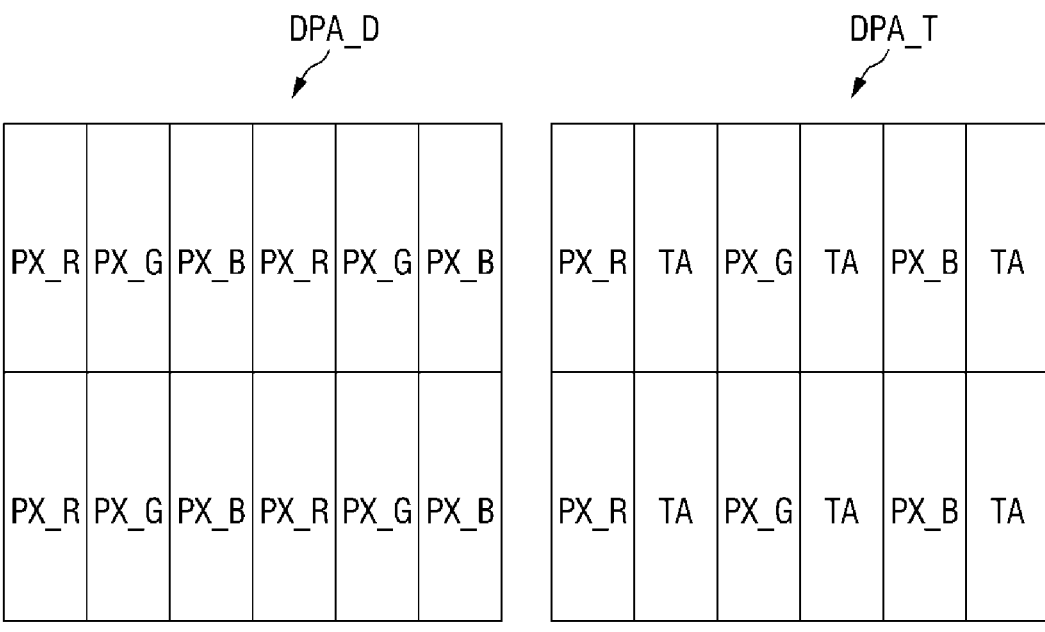
FIG. 7 is a schematic view illustrating an arrangement of pixels and light transmission regions of each region of a display panel according to an exemplary embodiment.
Figure 7:

FIG. 7 is a schematic view illustrating an arrangement of pixels and light transmission regions of each region of a display panel according to an exemplary embodiment.

Referring to FIG. 7, in the present exemplary embodiment, each of a first display region DPA_D and a second display region DPA_T includes a red pixel PX_R, a green pixel PX_G, and a blue pixel PX_B. In the illustrated exemplary embodiment, the respective color pixels PX have the same size, and the pixel PX of the first display region DPA_D and the pixel PX of the second display region DPA_T also have the same size. The second display region DPA_T further includes a light transmission region TA in addition to the pixel PX. The light transmission region TA has the same size as the pixel PX in the embodiment depicted in FIG. 7, but the present disclosure is not limited thereto.

In the first display region DPA_D, the pixels PX with the same color are arranged in the second direction D2, and the pixels PX with different colors are alternately arranged in the first direction D1. For example, in the first display region DPA_D, the red pixel PX_R, the green pixel PX_G, the blue pixel PX_B, the red pixel PX_R, the green pixel PX_G, and the blue pixel PX_B may be sequentially arranged in the first direction D1.

In the second display region DPA_T, the pixel PX and the light transmission region TA are alternately arranged in the first direction D1. The pixels PX with different colors are arranged in the first direction D1. For example, in the second display region DPA_T, the red pixel PX_R, the light transmission region TA, the green pixel PX_G, the light transmission region TA, the blue pixel PX_B, and the light transmission region TA are sequentially arranged in the first direction D1. The pixels PX with the same color and/or the light transmission regions TA are arranged in the second direction D2. The number of the pixels PX may be the same as the number of the light transmission regions TA in the second display region DPA_T. In addition, an area of the pixel PX may be the same as an area of the light transmission region TA in the second display region DPA_T. In addition, the area of the light transmission regions TA may be 50% of the total area of the second display region DPA_T.

When the pixel PX and the light transmission region TA are alternately arranged in the second display region DPA_T (e.g., the light transmission region TA is located between the pixels PX), the presence of the light transmission region TA may not be easily visible compared to when the light transmission region TA having a large area is without an intervention of the pixel PX. Therefore, although the light transmission region TA is present, due to the alternately arranged pixels PX, an image may be displayed so naturally that a user of the display panel may not perceive whether a corresponding region is the first display region DPA_D or the second display region DPA_T. In addition, as described above, the second display region DPA_T may be utilized as a transparent display and/or a path for optical sensing due to the light transmission region TA transmitting light.

Meanwhile, in the case of the exemplary embodiment of FIG. 7, the number of the pixels PX is the same as the number of the light transmission regions TA in the second display region DPA_T. Assuming that the light transmission region TA and the pixel PX of each of the first display region DPA_D and the second display region DPA_T have the same size, the number of the pixels PX of the second display region DPA_T is half the number of the pixels PX of the first display region DPA_D. That is, the number of the pixels PX per unit area in the second display region DPA_T is half the number of the pixels PX per unit area in the first display region DPA_D, and thus, the second display region DPA_T has a resolution that may be half that of the first display region DPA_D. As a result, the display panel may be divided into a high resolution region having a relatively high resolution and a low resolution region having a relatively low resolution. When the high resolution region and the low resolution region are scattered in the display panel 10, in some cases, a user may perceive a corresponding region, and thus, image quality may be degraded. However, perceptibility by the user may be reduced by adjusting an arrangement of regions and contents displayed in each region.

Specifically, in general, when small characters and/or detailed scenes are displayed, and/or when dynamic actions (as in a sport screen) are expressed, a screen may be differently visible in high resolution compared to in low resolution. However, when large characters, figures, and/or static screens are expressed, a difference may not be noticeable in different resolutions. For example, when a display panel has the form as shown in FIG. 3 and is applied to a smartphone, unlike a central portion of the display panel, a region near to a short side (upper side in the drawing) of the display panel may be used to statically express set information of the smartphone (for example, a telecommunication company name, a sound/vibration icon, antenna strength, a battery charge icon, time, or the like). In addition, in the case of a wide screen having a high aspect ratio, most regions, except for a region near to a short side, may be used as a main display screen, and the region near to the short side may be used as a screen for guiding subsidiary information. In other words, a display region DPA of the display panel may include a main display region corresponding to the main display screen and a sub-display region for displaying subsidiary information. In such examples, when the second display region DPA_T of FIG. 7 is in a sub-display region located near to a short side of a display panel and the first display region DPA_D of FIG. 7 is in a main display region and/or the remaining sub-display region, it may hardly be revealed that the resolution of the second display region DPA_T is low, and the second display region DPA_T and the first display region DPA_D may not be visible so as to be distinguished as a separate region.

Figure 8:
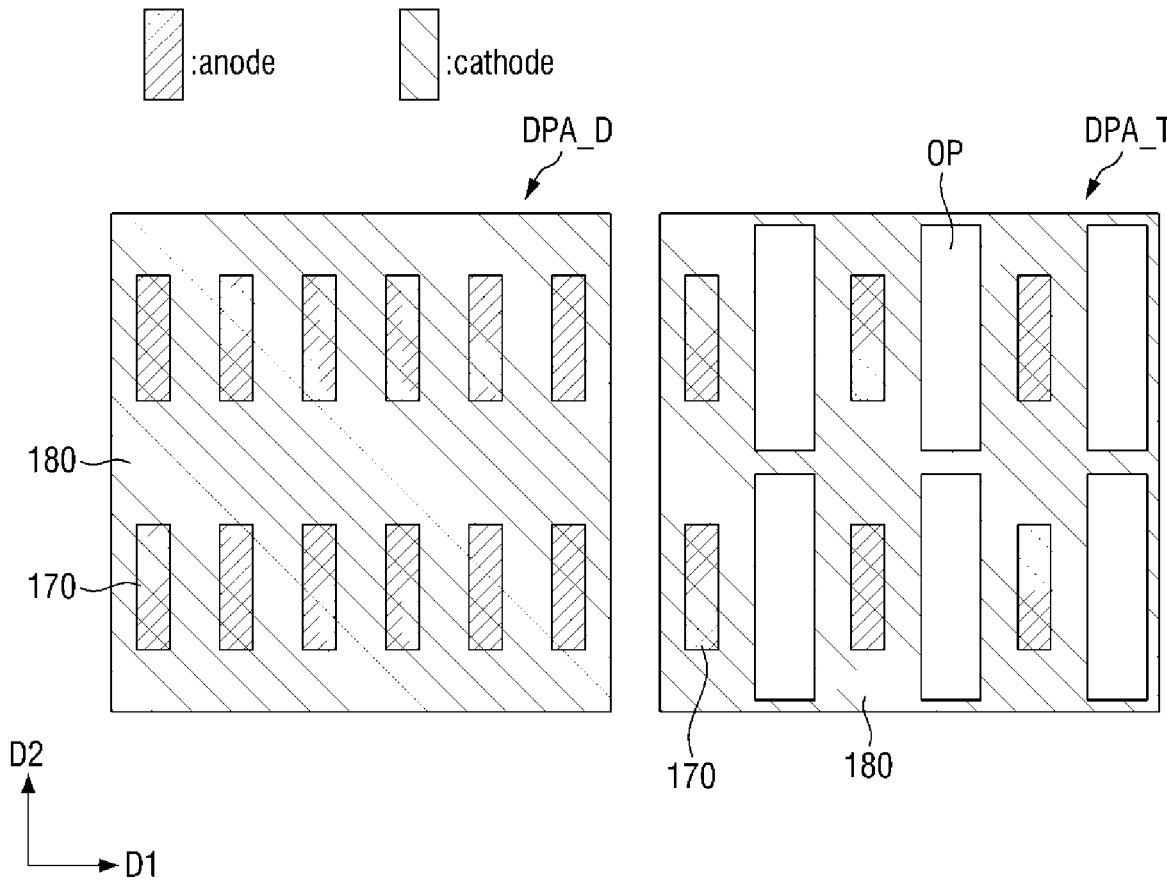
FIG. 8 illustrates an example arrangement of an anode and a cathode of the display panel of FIG. 7.

FIG. 8 illustrates an example arrangement of an anode and a cathode of the display panel of FIG. 7.

As shown in FIG. 8, the anode is for each pixel PX of the first display region DPA_D and the second display region DPA_T. The anode may have a smaller size than that of the pixel PX and may have a similar size to that of an emission region EMA. In an exemplary embodiment, the size of the anode may be the same as the size of the emission region EMA. In another exemplary embodiment, the size of the anode may be slightly greater than the size of the emission region EMA. For example, as shown in FIGS. 6A-6B, an edge of an anode may be covered with a pixel definition film.

When an emission region EMA is defined by an organic layer on the anode exposed by the pixel definition film, the size of the emission region EMA is smaller than the size of the anode.

A region except for the emission region EMA in the pixel PX may become a non-emission region NEA. The anode may not overlap the non-emission region NEA, or an edge of the anode may partially overlap the non-emission region NEA.

On the other hand, the cathode is on an entire surface of the first display region DPA_D and is only at a portion of the second display region DPA_T. A region, in which the cathode is not in the second display region DPA_T, becomes a light transmission opening OP. The light transmission opening OP corresponds to the above-described light transmission region TA. A size of the light transmission opening OP may be greater than or equal to the size of the anode. FIG. 8 illustrates a case in which the size of the light transmission opening OP is greater than the size of the anode.

In an exemplary embodiment, the size of the light transmission opening OP may be smaller than the size of the light transmission region TA. The light transmission region TA may include the light transmission opening OP and a peripheral region of the light transmission opening OP. The peripheral region of the light transmission opening OP may be the non-emission region NEA. FIGS. 7-8 illustrate the first display region DPA_D and the second display region DPA_T of the same display panel 10. FIG. 7 illustrates that the second display region DPA_T is divided into the pixels PX and the light transmission regions TA, where the light transmission regions TA are arranged in contact with each other in the second direction D2. Meanwhile, the light transmission openings OP shown in FIG. 8 are not physically connected in the second direction D2 and are separated by the cathode. A separation region between the adjacent light transmission openings OP or a peripheral region of the other light transmission openings OP as described above may become a region through which a line or the like passes (see FIGS. 16-18).

In another exemplary embodiment, the size of the light transmission opening OP may be the same as the size of the light transmission region TA. For example, as shown in FIGS. 6A-6B, the light transmission opening OP itself defines the light transmission region TA, and thus, the size of the light transmission opening OP may be the same as the light transmission region TA. In this case, the line or the like may cross the light transmission opening OP, but the present disclosure is not limited thereto.

Figure 9:
FIG. 9 is a schematic view illustrating an arrangement of pixels and light transmission regions of each region of a display panel according to another exemplary embodiment.

FIG. 9 is a schematic view illustrating an arrangement of pixels and light transmission regions of each region of a display panel according to another exemplary embodiment. The arrangement of the pixels PX of the present exemplary embodiment is different from that of the exemplary embodiment of FIG. 8.

As shown in FIG. 9, in a second display region DPA_T, pixels PX with different colors may be arranged in the second direction D2. A red pixel PX_R and a blue pixel PX_B are arranged adjacent to each other in the second direction D2 in a first column of FIG. 9. A green pixel PX_G and a red pixel PX_B are arranged adjacent to each other in the second direction D2 in a third column. A blue pixel PX_B and a green pixel PX_G are adjacent to each other in the second direction D2 in a fifth column. Furthermore, the same arrangement may be repeated in additional rows arranged in the second direction D2 (e.g., a repeated arrangement of two color pixels PX), and three color pixels PX such as the red pixel PX_R, the green pixel PX_G, and the blue pixel PX_B may be arranged in a repeating unit in the second direction D2 (e.g., a repeated arrangement of three-color pixels PX).

In addition, FIG. 9 illustrates that the arrangement of the pixels PX of a first display region DPA_D may be different from the arrangement of the pixels PX of a second display region DPA_T. In FIG. 9, the arrangement of the pixels PX of the first display region DPA_D is different from that of the second direction D2 in that the pixels PX with the same color are arranged in the second direction D2. In another exemplary embodiment, the pixels PX of the first display region DPA_D may be arranged in the second direction D2 using the same rule as in the second display region DPA_T.

Figure 10:
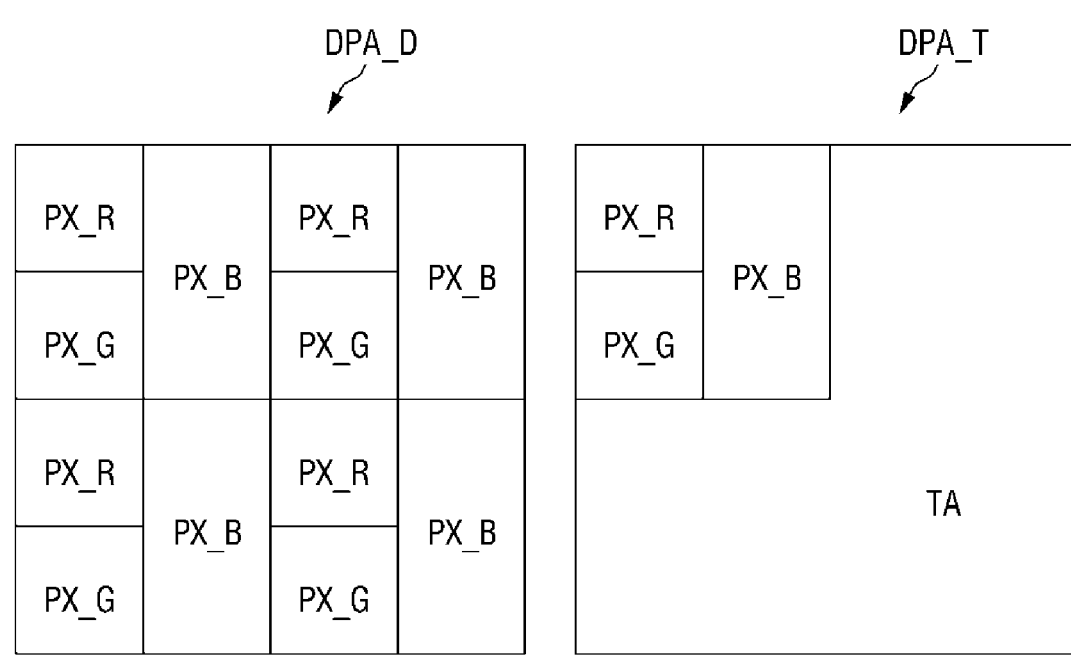
FIG. 10 is a schematic view illustrating an arrangement of pixels and light transmission regions of each region of a display panel according to still another exemplary embodiment.
Figure 10:
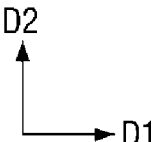

FIG. 10 is a schematic view illustrating an arrangement of pixels and light transmission regions of each region of a display panel according to another exemplary embodiment.

In the exemplary embodiment of FIG. 10, an example case is illustrated in which a size and an arrangement of pixels PX are different according to colors of the pixels in a first display region DPA_D and a second display region DPA_T, and an area of a light transmission region TA is greater than an area of the pixel PX in the transmission region DPA_T.

Referring to FIG. 10, in the first display region DPA_D, a red pixel PX_R and a green pixel PX_G are alternately arranged in the second direction D2 in first and third columns, and blue pixels PX_B are arranged in second and fourth columns. In the drawing, an example case is illustrated in which four rows are arranged, and the red pixels PX_R and the green pixel PX_G are arranged in one per row and the blue pixels PX_B are arranged in one per two rows. In the illustrated exemplary embodiment, a width of the blue pixel PX_B in the second direction D2 is twice a width of the red pixel PX_R and the green pixel PX_G in the second direction D2. In addition, a width of the red pixel PX_R and the green pixel PX_G in the first direction D1 may be the same as a width of the blue pixel PX_B in the first direction D1. A size (area) of the blue pixel PX_B may be twice a size (area) of each of the red pixel PX_R and the green pixel PX_G.

In the second display region DPA_T exemplarily illustrated in FIG. 10, a red pixel PX_R, a green pixel PX_G, and a blue pixel PX_B are in a first row, a second row, a first column, and a second column, and one light transmission region TA is in the remaining portion. The arrangement of the pixels PX at portions where the red pixel PX_R, the green pixel PX_G, and the blue pixel PX_B are the same as in the first display region DPA_D. The remaining portion corresponds to three sets of groups of red/green/blue pixels PX_R, PX_G, and PX_B of the first display region DPA_D. Therefore, the area of the light transmission region TA is three times the area occupied by the pixels PX in the second display region DPA_T. In addition, the area of the light transmission region TA may be 75% of the total area of the second display region DPA_T. Furthermore, resolution of the second display region DPA_T is ¼th of resolution of the first display region DPA_D.

In the case of the exemplary embodiment of FIG. 10, while the resolution of the second display region DPA_T is reduced to ¼th the size of the light transmission region TA is greatly increased. Therefore, it is suitable to apply a light sensing member requiring a large amount of light to a corresponding region.

Figure 11:
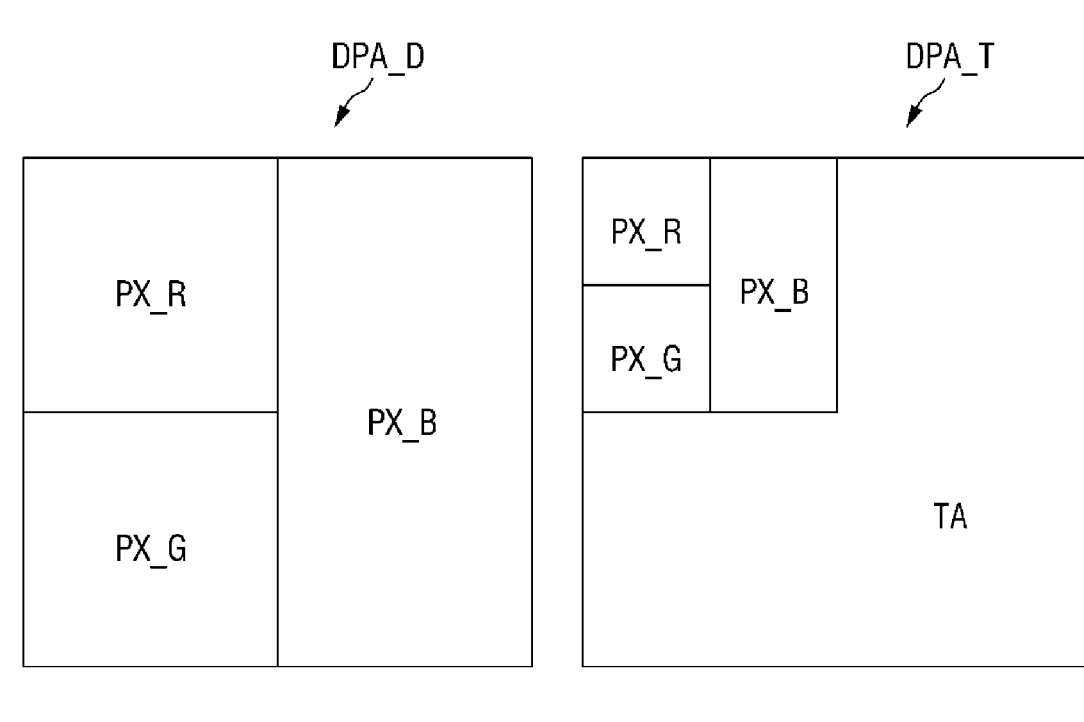
FIG. 11 is a schematic view illustrating an arrangement of pixels and light transmission regions of each region of a display panel according to yet another exemplary embodiment.
Figure 11:

FIG. 11 is a schematic view illustrating an arrangement of pixels and light transmission regions of each region of a display panel according to another exemplary embodiment.

In the exemplary embodiment of FIG. 11, an example case is illustrated in which a first display region DPA_D and a second display region DPA_T may have the same resolution, and a size of a pixel PX of the second display region DPA_T may be smaller than a size of a pixel PX of the first display region DPA_D.

Specifically, in the first display region DPA_D of FIG. 11, a red pixel PX_R and a green pixel PX_G are arranged in the second direction D2 in a first column, and a blue pixel PX_B is arranged in a second column. In the second display region DPA_T, a region corresponding to the red pixel PX_R of the first display region DPA_D is divided into three pixels PX_R, PX_G, and PX_B, and a light transmission region TA is in a region corresponding to the green pixel PX_G and the blue pixel PX_B of the first display region DPA_D. In the case of the present exemplary embodiment, an area occupied by the light transmission region TA is three times an area occupied by the pixels PX in the second display region DPA_T. That is, the area of the light transmission region TA may be 75% of the total area of the second display region DPA_T. The size of the pixel PX for each color in the second display region DPA_T is smaller than the size of a corresponding pixel PX for each color in the first display region DPA_D and is ¼th of the size of the corresponding pixel PX for each color in an illustrated example. However, because the number of the pixels PX in the same area arranged in the first display region DPA_D is the same as the number of the pixels PX in the same area arranged in the second display region DPA_T, resolution of the first display region DPA_D and resolution of the second display region DPA_T may be maintained to be the same as each other.

In the case of the present exemplary embodiment, because the size of the light transmission region TA is increased while the resolution of the second display region DPA_T is maintained to be the same as the resolution of the first display region DPA_D, it is suitable to apply a light sensing member requiring a large amount of light.

Figure 12:
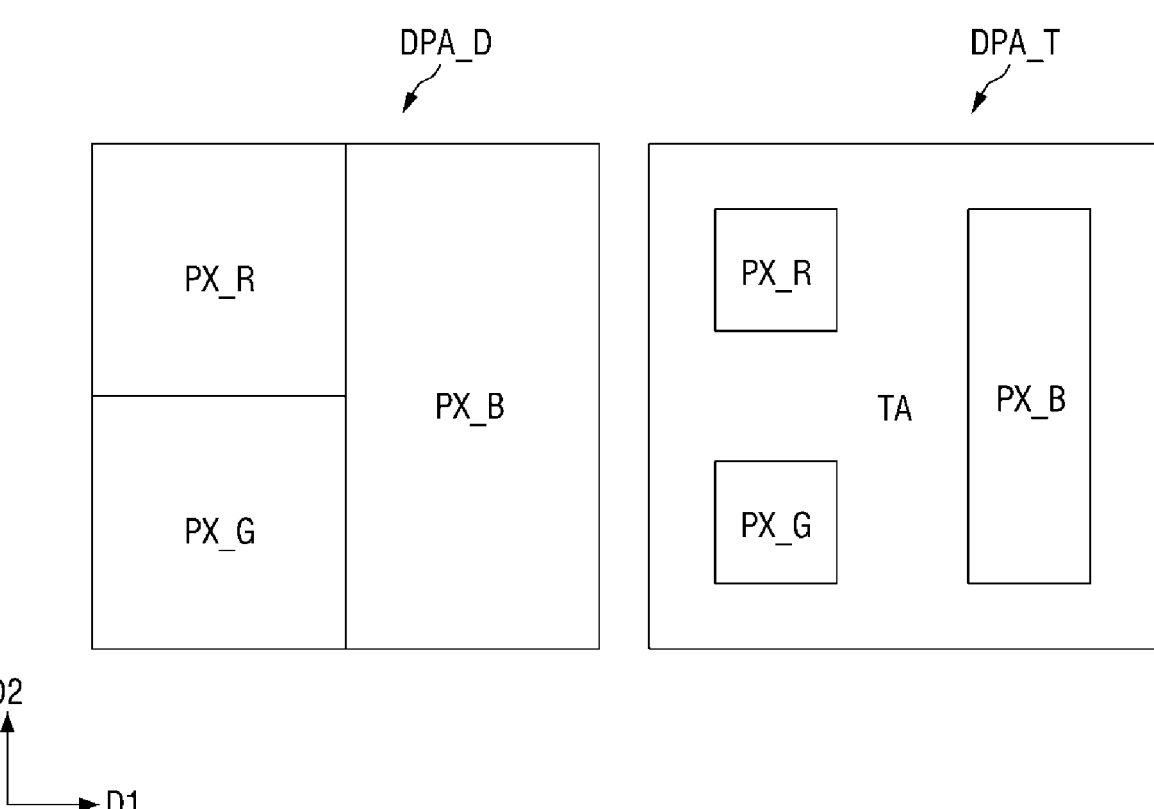
FIG. 12 is a schematic view illustrating an arrangement of pixels and light transmission regions of each region of a display panel according to yet another exemplary embodiment.

FIG. 12 is a schematic view illustrating an arrangement of pixels and light transmission regions of each region of a display panel according to another exemplary embodiment.

The exemplary embodiment of FIG. 12 is the same as the exemplary embodiment of FIG. 11 in that a first display region DPA_D and a second display region DPA_T have the same resolution and a size of a pixel PX of the second display region DPA_T is smaller than a size of a pixel PX of the first display region DPA_D, and is different from the exemplary embodiment of FIG. 11 in that the respective color pixels PX of the second display region DPA_T are not adjacent to each other and are distributed so as to be spaced apart from each other with a light transmission region TA therebetween.

Referring to FIG. 12, respective pixels PX of the second display region DPA_T are surrounded by the light transmission region TA. Color pixels PX_R, PX_G, and PX_B of the second display region DPA_T have a size smaller than a size of corresponding color pixels PX_R, PX_G, and PX_B of the first display region DPA_D, but the number of the pixels PX of the second display region DPA_T is the same as the number of the pixels PX of the first display region DPA_D based on the same area.

In the present exemplary embodiment, a size of the light transmission region TA may be increased while resolution of the second display region DPA_T is maintained to be the same as the resolution of the first display region DPA_D, and the pixels PX of the second display region DPA_T may be distributed so that the light transmission region TA may not be easily visible.

Figure 13:
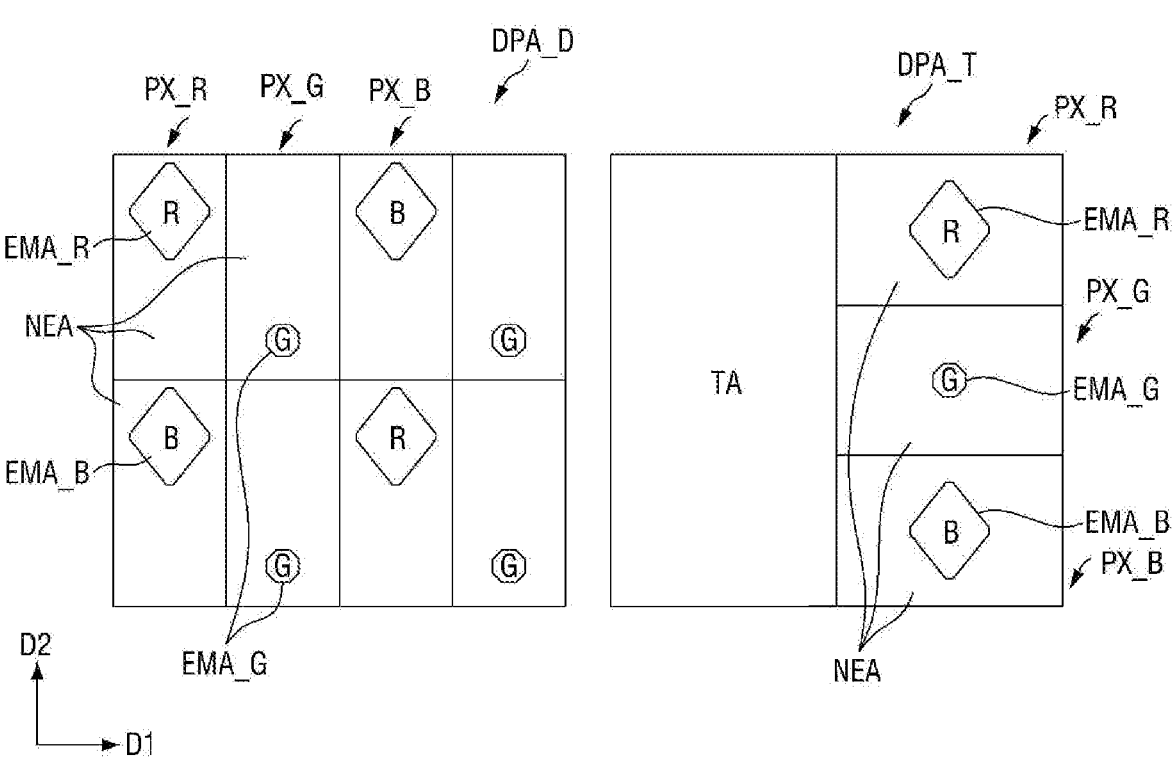
FIG. 13 is a schematic view illustrating an arrangement of pixels and light transmission regions of each region of a display panel according to yet another exemplary embodiment.

FIG. 13 is a schematic view illustrating an arrangement of pixels and light transmission regions of each region of a display panel according to another exemplary embodiment, and illustrating an emission region and a non-emission region of each pixel so as to be separated.

In the exemplary embodiment of FIG. 13, an example case is illustrated in which emission regions EMA of a first display region DPA_D are arranged in a PENTILE® scheme (PENTILE® is a registered trademark of Samsung Display Co., Ltd., Yongin-Si, Gyeonggi-do, Republic of Korea, respective color emission regions EMA of a second display region DPA_T are alternately arranged in one column, and a light transmission region TA and pixels PX are alternately arranged in the first direction D1.

Referring to FIG. 13, in the first display region DPA_D, pixels P, e.g., a red pixel PX_R, a green pixel PX_G, a blue pixel PX_B, and a green pixel PX_G, are sequentially and alternately arranged in the first direction D1. Twice as many of the green pixels PX_G are arranged as each of the red pixels PX_R and the blue pixels PX_B. The red pixel PX_R and the blue pixel PX_B are alternately arranged in the second direction D2 in first and third columns, and the green pixels PX_G are arranged in the second direction D2 in second and fourth columns.

In an exemplary embodiment, the emission regions EMA of respective color pixels PX may have different shapes and sizes.

For example, a red emission region EMA_R and a blue emission region EMA_B may each have a rhombic shape, a rhombic shape with a rounded corner, or an octagonal shape of which a length of sides in the first direction D1 and the second direction D2 is less than a length of sides thereof in a diagonal direction. On the other hand, a green emission region EMA_G may have a square shape, a square shape with a rounded corner, or a regular octagonal shape. However, the present disclosure is not limited thereto, and at least one of the red emission region EMA_R, the blue emission region EMA_B, and the green emission region EMA_G may have substantially a circular shape.

The red emission region EMA_R and the blue emission region EMA_B may have substantially the same size. The green emission region EMA_G may be smaller than the red emission region EMA_R and/or the blue emission region EMA_B. In an exemplary embodiment, an area of the green emission region EMA_G may be half of an area of the red emission region EMA_R or the blue emission region EMA_B, but the present disclosure is not limited thereto.

Each of the red emission region EMA_R and the blue emission region EMA_B may be biased to one side (e.g., upper side in the drawing) in the second direction D2 in each of corresponding pixels PX, and the green emission region EMA_G may be biased to the other side (e.g., lower side in the drawing) in the second direction D2 in a corresponding pixel PX. Centers of the red emission region EMA_R and the blue emission region EMA_B may be arranged on one straight line in the first direction D1, and the green emission regions EMA_G may be arranged on a straight line different from the one straight line. On the basis of such a relationship, one pixel PX row may be divided into two emission region rows. A first emission region row of each pixel PX row is a row in which the red emission region EMA_R and the blue emission region EMA_B are alternately arranged, and a second emission region row thereof is a row in which the green emission regions EMA_G are arranged. In each emission region row, one emission region EMA is in every two columns. An emission region EMA may be in only one emission region row of two emission region rows belonging to the same pixel PX row with respect to the same column. The emission regions EMA in the first emission region row and the second emission region row may be arranged in zigzag patterns without being aligned in the second direction D2.

In an exemplary embodiment, a distance between the second emission region row and the first emission region row belonging to the same pixel PX row may be substantially the same as a distance between the second emission region row and a first emission region row belonging to a pixel PX row adjacent to the second emission region row. That is, the first emission region row and the second emission region row may be alternately arranged at regular intervals in the second direction D2.

In the first display region DPA_D, in order to display an image, each pixel PX may be partially shared with an adjacent pixel PX. This may result in a substantial resolution increase. Because such a screen display according to PEN-TILE® scheme is known to one of ordinary skill in the art, detailed descriptions thereof will be omitted.

A second display region DPA_T may have a pixel PX arrangement different from a PENTILE® arrangement of the first display region DPA_D. In an example of FIG. 13, in the case of the second display region DPA_T, a light transmission region TA is in a first column, and a red pixel PX_R, a green pixel PX_G, and, a blue pixel PX_B are sequentially and alternately arranged in a second column. A shape and a size of an emission region EMA for each color in the second display region DPA_T may be the same as a shape and a size of a shape and a size of the emission region EMA for each color in the first display region DPA_D.

In the second display region DPA_T, each of a red emission region EMA_R, a green emission region EMA_G, and a blue emission region EMA_B may be at a center portion of a pixel PX, and a center thereof may be on a straight line extending in the second direction D2. A size of the light transmission region TA may be the same as a size of the four pixels PX of the first display region DPA_D. An area of the three pixels PX of the second display region DPA_T may be the same as an area of the four pixels PX of the first display region DPA_D. The area occupied by the light transmission region TA in the second display region DPA_T may be half of the total area of the second display region DPA_T.

Figure 14:
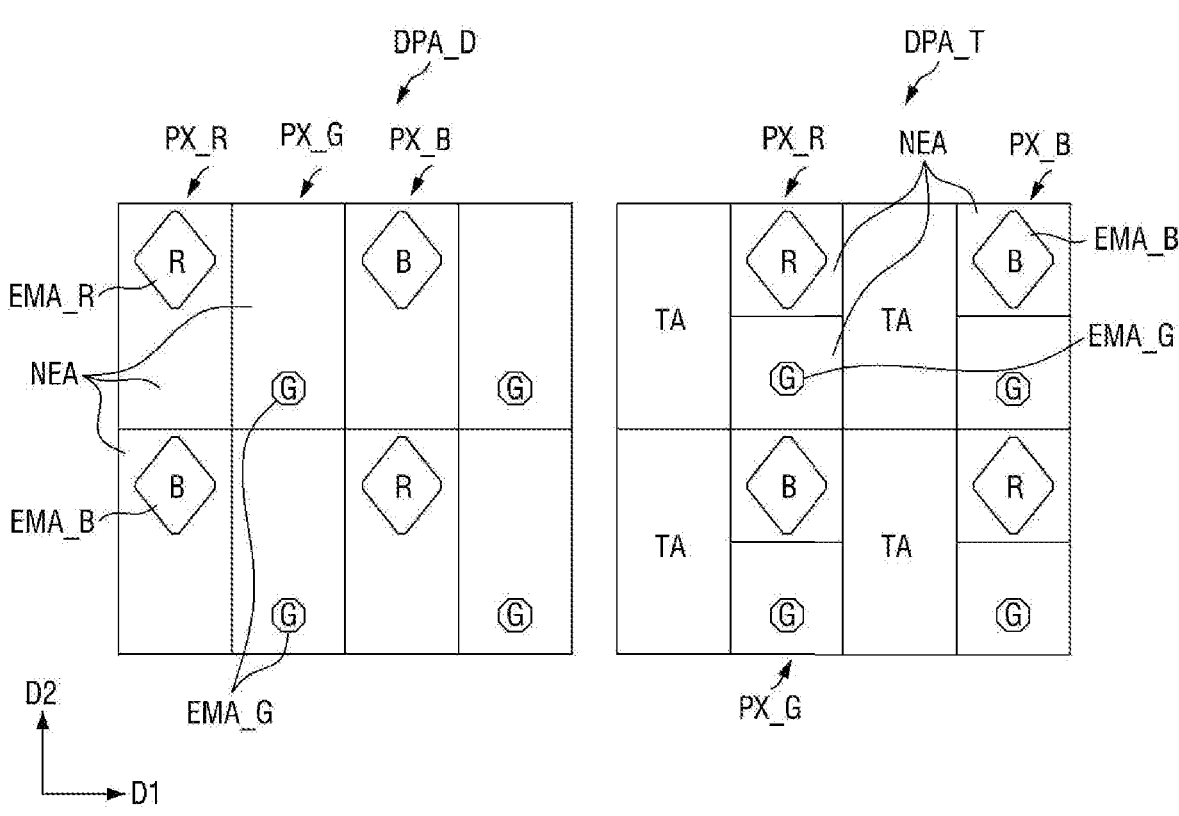
FIG. 14 is a schematic view illustrating an arrangement of pixels and light transmission regions of each region of a display panel according to yet another exemplary embodiment.

FIG. 14 is a schematic view illustrating an arrangement of pixels and light transmission regions of each region of a display panel according to another exemplary embodiment.

In the display panel according to the present exemplary embodiment, an arrangement of pixels PX and emission regions EMA of a first display region DPA_D is the same as that of FIG. 13, and an arrangement of pixels PX and light transmission regions TA of a second display region DPA_T is different from the exemplary embodiment of FIG. 13.

Referring to FIG. 14, the light transmission regions TA are in first and third columns of the second display region DPA_T. A size of the light transmission region TA may be the same as a size of the pixel PX of the first display region DPA_D. The pixels PX are arranged in second and fourth columns of the second display region DPA_T. The pixels PX, e.g., a red pixel PX_R, a green pixel PX_G, a blue pixel PX_B, and a green pixel PX_G, are sequentially arranged in the second direction D2.

Each pixel PX of the second display region DPA_T is for each emission region row of the first display region DPA_D. A size of the pixel PX of the second display region DPA_T may be ½ of a size of the pixel PX of the first display region DPA_D.

In the illustrated exemplary embodiment, the number of
the pixels PX in the same area in the first display region
DPA_D is the same as the number of the pixels PX in the
same area in the second display region DPA_T. Therefore,
the second display region DPA_T may exhibit the same
resolution as the first display region DPA_D.

In addition, in the illustrated example, the size of the pixel
PX of the second display region DPA_T is smaller than the
size of the pixel PX of the first display region DPA_D, but
a size of each emission region EMA of the second display
region DPA_T is the same as a size of each emission region
EMA of the first display region DPA_D. In the exemplary
embodiment, while the second display region DPA_T
includes the light transmission region TA, the second display
region DPA_T may secure the same resolution and emission
luminance as the first display region DPA_D.

Figure 15:
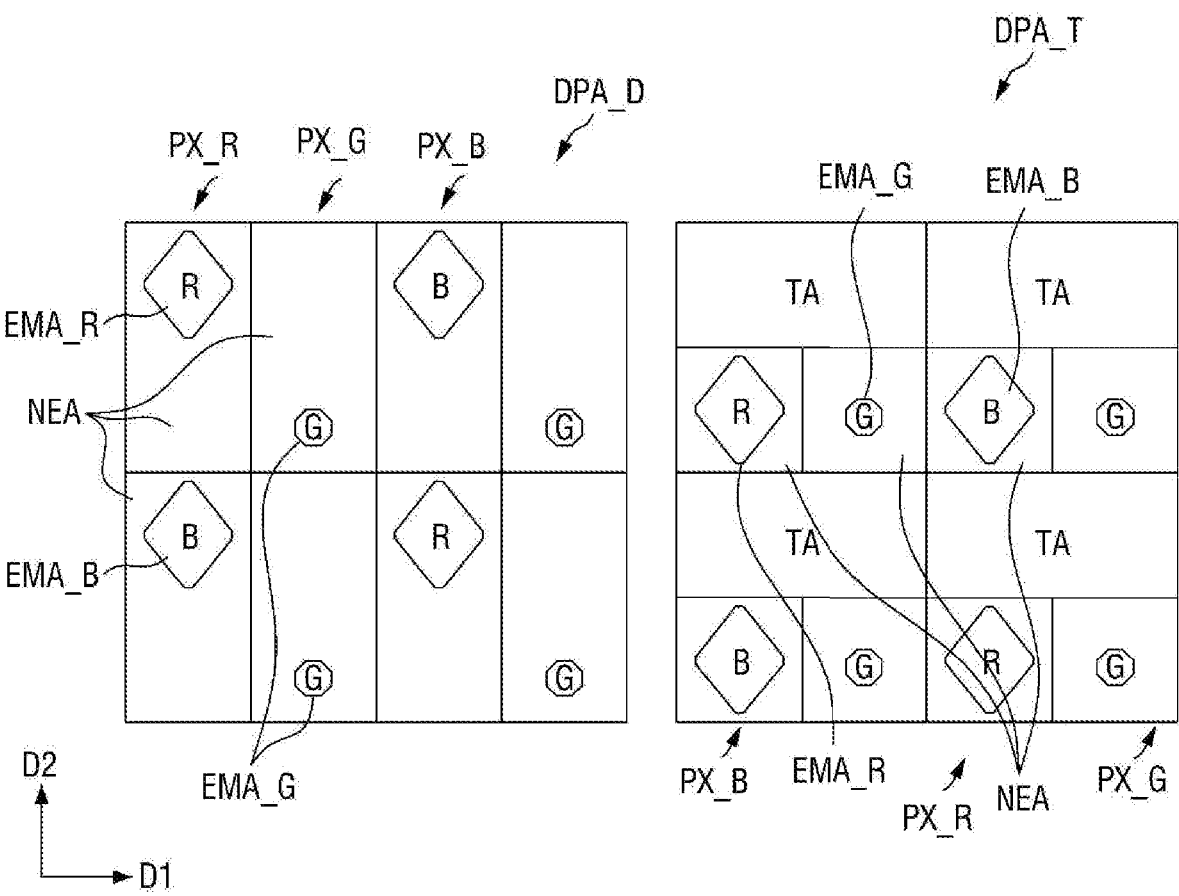
FIG. 15 is a schematic view illustrating an arrangement of pixels and light transmission regions of each region of a display panel according to yet another exemplary embodiment.

FIG. 15 is a schematic view illustrating an arrangement of
pixels and light transmission of each region of a display
panel according to another exemplary embodiment.

In the display panel according to the present exemplary
embodiment, an arrangement of pixels PX and emission
regions EMA of a first display region DPA_D is the same as
that of FIG. 14, and an arrangement of pixels PX and light
transmission regions TA of a second display region DPA_T
is different from the exemplary embodiment of FIG. 14.

Referring to FIG. 15, the light transmission regions TA are
arranged in first and third rows of the second display region
DPA_T. The pixels PX are arranged in second and fourth
rows of the second display region DPA_T. The pixels PX,
e.g., a red pixel PX_R, a green pixel PX_G, a blue pixel
PX_B, and a green pixel PX_G are sequentially arranged in
the first direction D1. In the present exemplary embodiment,
the first and third rows of the second display region DPA_T
correspond to first emission region rows of the first and
second rows of the first display region DPA_D, and the
second and fourth rows of the second display region DPA_T
correspond to second emission region rows of the first and
second emission region rows of the first display region
DPA_D.

In the case of the present exemplary embodiment, the
arrangement of the light transmission regions TA and the
pixels PX of the second display region DPA_T corresponds
to a case in which a direction of the columns and the rows
of the exemplary embodiment of FIG. 14 is changed. An
arrangement except for such a case is substantially the same
as the exemplary embodiment of FIG. 14. Therefore, similar
to the exemplary embodiment of FIG. 14, the second display
region DPA_T may exhibit the same resolution as the first
display region DPA_D. Furthermore, while the second dis-
play region DPA_T includes the light transmission region
TA, the second display region DPA_T may secure the same
resolution and emission luminance as the first display region
DPA_D.

The above-described exemplary embodiments may be
variously combined. For example, a display panel may
include the first display region DPA_D according to one
exemplary embodiment and the second display region
DPA_T according to another exemplary embodiment among
the above-described embodiments. In addition, a display
panel may include a plurality of second display regions
DPA_T, one second display region DPA_T may have the
arrangement of the above-described one exemplary embodi-
ment, and another second display region DPA_T may have
the arrangement of one of the above-described other exem-
plary embodiments. The combinations of the exemplary
embodiments may be determined according to the position, number, required transmittance, resolution, and the like of
the second display regions DPA_T.

Figure 16:
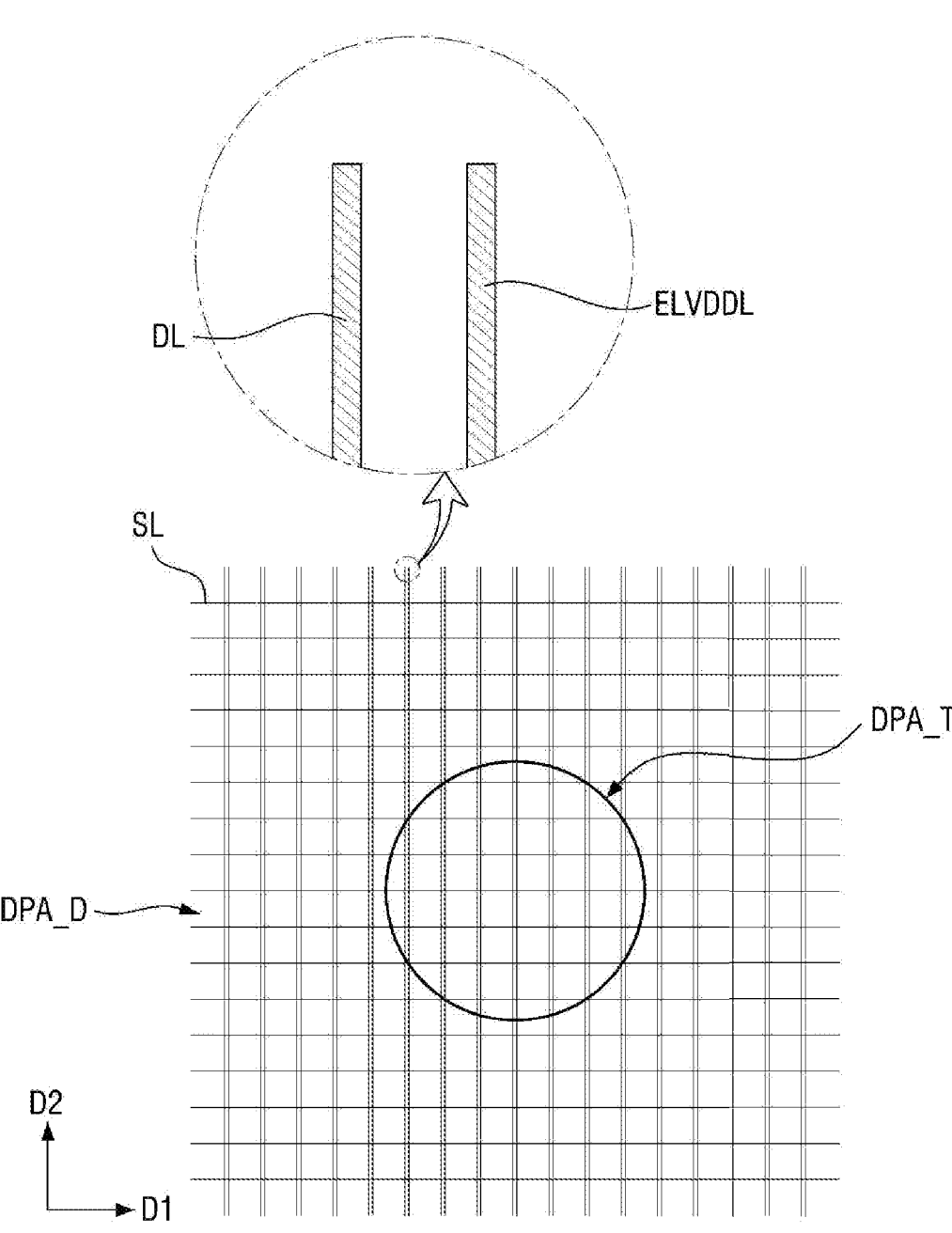
FIG. 16 is a schematic view illustrating a line arrangement of a display panel according to an exemplary embodiment.

FIG. 16 is a schematic view illustrating a line arrangement
of a display panel according to an exemplary embodiment.

FIG. 16 illustrates a case in which a circular second
display region DPA_T is within a first display region
DPA_D. The second display region DPA_T is surrounded by
the first display region DPA_D.

The display panel includes a plurality of signal lines. The
plurality of signal lines includes a plurality of scan lines SL,
a plurality of data lines DL, and a plurality of first power
voltage lines ELVDDL.

Each of the scan lines SL extends in the first direction D1,
and some scan lines SL cross both of the first display region
DPA_D and the second display region DPA_T. Each of the
data lines DL and each of the first power voltage lines
ELVDDL extends in the second direction D2, and some data
lines DL and some first power voltage lines ELVDDL cross
both of the first display region DPA_D and the second
display region DPA_T.

As described with reference to FIG. 5, a pixel circuit is
connected to the scan line SL, the data line DL, and the first
power voltage line ELVDDL, and the lines are shared by a
plurality of pixels PX. However, the second display region
DPA_T may include a light transmission region TA and an
arrangement of pixels PX of the second display region
DPA_T may be different from that of the first display region
DPA_D, and thus, an arrangement of the signal lines of the
second display region DPA_T may also be different from
that of the first display region DPA_D.

Figure 17:
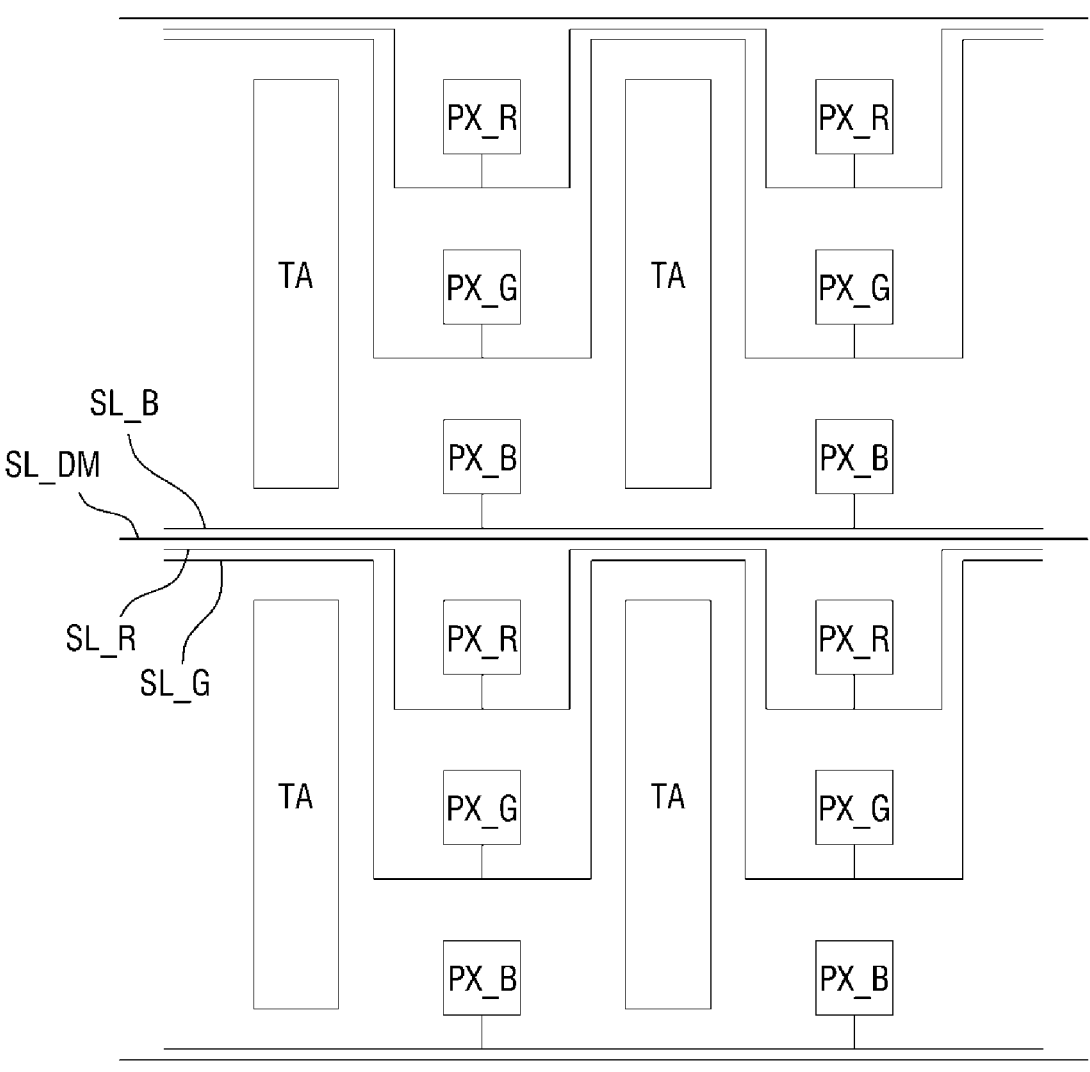
FIG. 17 is a schematic view illustrating an arrangement of some lines in a second display region of a display device according to some exemplary embodiments.
Figure 17:
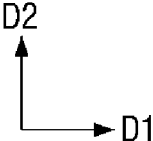
Figure 18:
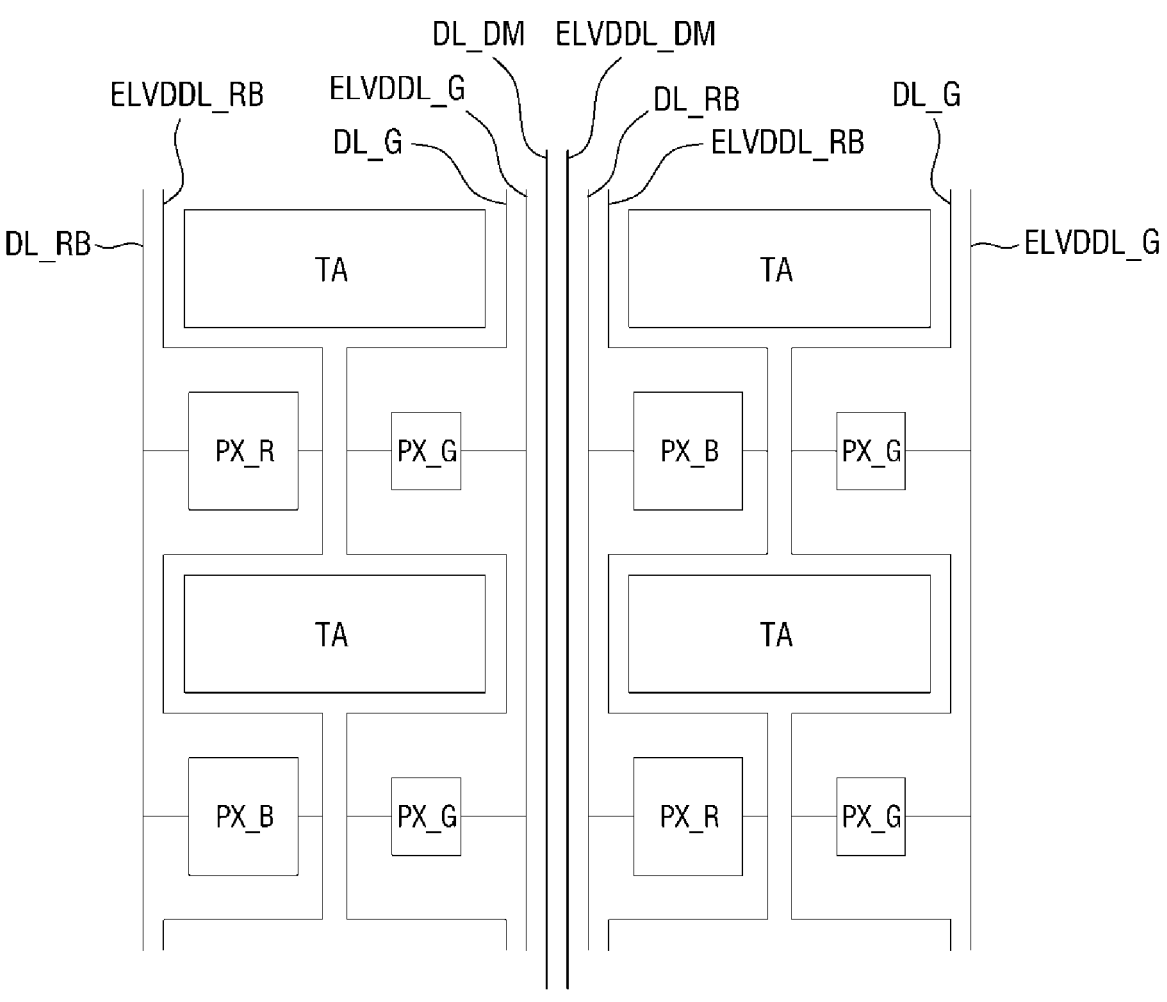
FIG. 18 is a schematic view illustrating an arrangement of data lines and first power voltage lines in a second display region of a display device according to some exemplary embodiments.
Figure 18:
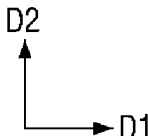

Detailed descriptions are given with reference to FIGS.
17-18.

FIG. 17 is a schematic view illustrating an arrangement of
some lines in a second display region of a display device
according to some exemplary embodiments. FIG. 17 illus-
trates a case in which a width of a light transmission region
TA in the second direction D2 is greater than a width of a
pixel PX in the second direction D2. The arrangement of the
emission regions EMA of the pixels PX and the light
transmission regions TA of the second display region
DPA_T of FIG. 13 is applied to FIG. 17 as such an example.
In FIG. 17, scan lines SL are illustrated as the some lines,
and data lines and first power voltage lines are not illustrated
for convenience of description.

Referring to FIG. 17, in a second display region DPA_T,
a light transmission region TA or pixels PX are arranged for
each column. The light transmission regions TA or the pixels
PX are not in a space between adjacent columns in the
second direction D2. Therefore, as the data line and the first
power voltage line extending in the second direction D2 may
be between a light transmission region TA column and a
pixel PX column, the data line and the first power voltage
line may be arranged without crossing the light transmission
region TA.

On the other hand, one light transmission region TA
corresponds to three pixels PX in a row direction. A pixel PX
located at a point corresponding to a middle of the light
transmission region TA is covered by the light transmission
region TA in the row direction. A scan line SL extending in
the first direction D1, e.g., the row direction needs to be
connected to the pixel PX covered by the light transmission
region TA. The scan line SL may be connected to the
covered pixel PX across the light transmission region TA,
but in this case, light transmittance of the light transmission
region TA may be lowered.

An example arrangement for allowing the scan line SL to
bypass the light transmission region TA so as to not overlap the light transmission region TA is illustrated in FIG. 17. That is, a plurality of scan lines SL pass through a space between adjacent light transmission regions TA in the second direction D2. The plurality of scan lines SL extend in parallel in the first direction D1 in the space between the light transmission regions TA. The plurality of scan lines may include a red scan line SL_R, a green scan line SL_G, and a blue scan line SL_B. The red scan line SL_R is connected to a red pixel PX_R, the green scan line SL_G is connected to a green pixel PX_G, and the blue scan line SL_B is connected to a blue pixel PX_B, but the present disclosure is not limited thereto.

The red scan line SL_R is curved toward the red pixel PX_R when the red scan line SL-R reaches a column in which the pixels PX are located, partially surrounds the red pixel PX_R around one or more edges, and then leads again to a space between the red pixel PX_R and adjacent light transmission region TA. The green scan line SL_G is curved towards the green pixel PX_G when the green scan line SL_G reaches the column in which the pixels PX are located, partially surrounds the green pixel PX_G around one or more edges, and then leads again to a space between the green pixel PX_G and adjacent light transmission region TA. That is, the red scan line SL_R and the green scan line SL_G bypass a certain distance in the second direction D2 in the column in which the pixels PX are located. On the other hand, the blue scan line SL_B may be connected to the blue pixel PX_B adjacent thereto in the pixel PX column while extending in the first direction D1 without a bypass. However, the present disclosure is not limited thereto.

Each of the red scan line SL_R and the green scan line SL_G may include a first bypass extension portion extending to one side (e.g., lower side in the drawing) of the second direction D2, a second bypass extension portion extending in the first direction D1, and a third bypass extension portion extending to the other side (e.g., upper side in the drawing) of the second direction D2 in a bypass section.

A bypass distance of the green scan line SL_G is illustrated in the drawing as being greater than a bypass distance of the red scan line SL_R, but the present disclosure is not limited thereto. The bypass distance may be variously modified according to the arrangement of the pixels PX and the design of the lines as those of ordinary skill in the art would appreciate.

In an exemplary embodiment, the plurality of scan lines SL may further include a dummy scan line SL_DM. For example, when the first display region DPA_D requires higher resolution or more scan lines SL for the arrangement of the pixels PX as compared to the second display region DPA_T, some scan lines SL may become a dummy scan line SL_DM that is not connected to the pixels PX and passes the pixels PX in the second display region DPA_T. On the contrary, when the second display region DPA_T requires more scan lines SL for the arrangement of the pixels PX as compared to the first display region DPA_D, a dummy scan line may be in the first display region DPA_D.

FIG. 18 is a schematic view illustrating an arrangement of data lines and first power voltage lines in a second display region of a display device according to some exemplary embodiments. FIG. 18 illustrates an example case in which a width of a light transmission region TA in the first direction D1 is greater than a width of a pixel PX in the first direction D1. The arrangement of the emission regions EMA of the pixels PX and the light transmission regions TA of the second display region DPA_T of FIG. 15 is applied to FIG. 18 as an example. In FIG. 18, data lines SL and first power voltage lines ELVDDL are illustrated as some lines, and scan lines are not illustrated for convenience of description.

Referring to FIG. 18, when the second display region DPA_T has a pixel PX arrangement like that shown in FIG. 15, light transmission regions TA or pixels PX may be arranged for each row, and the light transmission region TA or the pixel PX may not be in a space between adjacent rows in the first direction D1. Therefore, a scan line extending in the first direction D1 may be between a light transmission region TA row and a pixel PX row, and thus, the scan line may not cross the light transmission region TA.

On the other hand, in a column direction, one light transmission region TA may correspond to two pixels PX, and some pixels PX may be covered by the light transmission region TA. Therefore, in order to prevent an overlap between a line and the light transmission region TA, at least one of a data line DL and a first power voltage line ELVDDL extending in the second direction D2, e.g., the column direction, may include a bypass line.

Specifically, a red/blue data line DL_RB, a green data line DL_G, a first red/blue power voltage line ELVDDL_RB, and a first green power voltage line ELVDDL_G extend in parallel in the second direction D2 in a space between the light transmission regions TA adjacent to each other in the first direction D1.

The red/blue data line DL_RB and the first green power voltage line ELVDDL_G extend in the second direction D2 without a bypass and are connected to a red/blue pixel PX_B and a green pixel PX_G adjacent thereto.

Each of the green data line DL_G and the first red/blue power voltage line ELVDDL_RB is curved toward pixels PX when reaching a pixel PX row, surrounds the pixels PX, and then leads again to a space between the pixel PX and adjacent light transmission region TA. That is, each of the green data line DL_G and the first red/blue power voltage line ELVDDL_RB includes a bypass section in the pixel PX row. The bypass section may include a first bypass extension portion extending to one side (or the other side) of the first direction D1, a second bypass extension portion extending in the second direction D2, and a third bypass extension portion extending to the other side (or one side) of the first direction D1.

In an exemplary embodiment, a dummy data line DL_DM and/or a dummy first power voltage line ELVDDL_DM may extend in the second direction D2 for the same reason as the exemplary embodiment of FIG. 17.

As described above, when the light transmission region TA having the width greater than the width of the pixel PX in the first direction D1 or the second direction D2 is in the second display region DPA_T, some lines may include the bypass section and thus may not overlap the light transmission region TA. Accordingly, the light transmittance of the light transmission region TA and the second display region DPA_T including the same may be maintained to be high.

A display device according to an exemplary embodiment has a light transmission path and is concurrently capable of maximizing a screen. Therefore, although various optical sensing members are adopted, a wide screen can be secured. In addition, according to some exemplary embodiments, although resolutions of some regions are sacrificed for light transmission, the visibility of a corresponding region can be minimized through a proper arrangement of the corresponding region.

Effects of the present disclosure are not restricted to the exemplary embodiments set forth herein and more diverse effects are included in this description.

Although the exemplary embodiments of the present disclosure have been described with reference to the accompanying drawings, it will be understood by those skilled in the art to which the present disclosure pertains that the present disclosure can be carried out in other detailed forms without changing the technical spirits and essential features thereof. Therefore, the above-described exemplary embodiments of the present disclosure are merely exemplary in all aspects and should not be construed to be limited and the sprit and scope of the present disclosure is to be indicated by the appended claims and their equivalents.

What is claimed is:

1. A display device comprising a display region that comprises a first display region and a second display region,
    wherein the first display region comprises a plurality of first pixels, and the second display region comprises a plurality of second pixels and at least one light transmission region,
    wherein light transmittance of the at least one light transmission region is higher than light transmittance of each of the first pixels and light transmittance of each of the second pixels, and light transmittance of the second display region is higher than light transmittance of the first display region,
    wherein a resolution of the second display region is lower than or equal to half of a resolution of the first display region, and
    wherein any side of each of the at least one light transmission region of the second display region is directly adjacent to and touches three or less of the plurality of second pixels of the second display region, and
    wherein the light transmission region is spaced from a light emitting layer of the plurality of second pixels in a first direction that is perpendicular to a thickness direction of display device.

2. The display device of claim 1, wherein the resolution of the second display region is half of the resolution of the first display region.

3. The display device of claim 1, wherein the resolution of the second display region is ¼th of the resolution of the first display region.

4. The display device of claim 1, wherein an area of the first pixels is the same as an area of the second pixels of a same color.

5. The display device of claim 1, wherein an area of the first pixels is different from an area of the second pixels of a same color.

6. The display device of claim 1, wherein the at least one light transmission region comprises a plurality of light transmission regions, and wherein the plurality of light transmission regions and the plurality of second pixels are alternately arranged.

7. The display device of claim 1, further comprising a substrate over the first display region and the second display region.

8. The display device of claim 7, wherein the substrate overlaps the at least one light transmission region.

9. The display device of claim 1, wherein an area occupied by the at least one light transmission region is 50% or more of the second display region.

10. The display device of claim 1, further comprising a light sensing member overlapping the second display region.

11. The display device of claim 10, wherein the light sensing member comprises at least one of a camera, an infrared proximity sensor, an iris recognition sensor, and a fingerprint sensor comprising a photoelectric conversion element.

12. The display device of claim 1, further comprising a non-display region around the display region,
    wherein the second display region is in partial contact with the non-display region.

13. The display device of claim 1, wherein each of the plurality of first pixels and each of the plurality of second pixels comprises an emission region and a non-emission region around the emission region having light transmittance that is lower than the light transmittance of the at least one light transmission region.

14. A display device comprising a display region that comprises a first display region and a second display region,
    wherein the first display region comprises a plurality of first pixels, and the second display region comprises a plurality of second pixels and at least one light transmission region,
    wherein light transmittance of the at least one light transmission region is higher than light transmittance of each of the first pixels and light transmittance of each of the second pixels, and light transmittance of the second display region is higher than light transmittance of the first display region,
    wherein each of the plurality of first pixels and each of the plurality of second pixels comprises an emission region and a non-emission region around the emission region,
    wherein the emission region of at least one of the plurality of second pixels has a generally polygonal shape with a rounded corner,
    wherein any side of each of the at least one light transmission region of the second display region is directly adjacent to and touches three or less of the plurality of second pixels of the second display region, and
    wherein the light transmission region is spaced from a light emitting layer of the plurality of second pixels in a first direction that is perpendicular to a thickness direction of display device.

15. The display device of claim 14, wherein the emission region of at least one of the plurality of first pixels has a generally polygonal shape with a rounded corner.

16. The display device of claim 14, wherein a shape of the emission region of at least one of the plurality of second pixels is the same as a shape of the emission region of at least one of the plurality of first pixels.

17. The display device of claim 14, wherein an area of the first pixels is different from an area of the second pixels of a same color.

18. The display device of claim 14, wherein a resolution of the second display region is lower than or equal to half of a resolution of the first display region.

19. The display device of claim 18, wherein the resolution of the second display region is half of the resolution of the first display region.

20. The display device of claim 19, wherein the resolution of the second display region is ¼th of the resolution of the first display region.

\* \* \* \* \*